United States Patent
Yamashita

(10) Patent No.: US 8,017,299 B2
(45) Date of Patent: Sep. 13, 2011

(54) POSITIVE RESIST COMPOSITION AND PATTERN FORMING METHOD USING THE SAME

(75) Inventor: Katsuhiro Yamashita, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 267 days.

(21) Appl. No.: 12/257,646

(22) Filed: Oct. 24, 2008

(65) Prior Publication Data

US 2009/0111053 A1    Apr. 30, 2009

(30) Foreign Application Priority Data

Oct. 26, 2007    (JP) ................... 2007-279578

(51) Int. Cl.
*G03F 7/004*    (2006.01)
*G03F 7/30*    (2006.01)

(52) U.S. Cl. .............. 430/270.1; 430/326; 430/905; 430/910

(58) Field of Classification Search ........... 430/270.1, 430/905, 910, 326
See application file for complete search history.

(56) References Cited

U.S. PATENT DOCUMENTS

| | | | |
|---|---|---|---|
| 5,561,194 A | | 10/1996 | Cornett et al. |
| 5,561,494 A | | 10/1996 | Terashita |
| 5,679,495 A | * | 10/1997 | Yamachika et al. .......... 430/191 |
| 5,683,856 A | * | 11/1997 | Aoai et al. .................. 430/270.1 |
| 5,942,367 A | * | 8/1999 | Watanabe et al. ............. 430/170 |
| 7,858,289 B2 | * | 12/2010 | Yamashita .................. 430/270.1 |
| 2004/0033438 A1 | | 2/2004 | Hamada et al. |
| 2006/0210922 A1 | * | 9/2006 | Nishiyama ................. 430/270.1 |
| 2008/0020288 A1 | * | 1/2008 | Hirayama et al. ................. 430/4 |

FOREIGN PATENT DOCUMENTS

| | | |
|---|---|---|
| JP | 2001-107707 A | 4/2001 |
| JP | 2001-166474 A | 6/2001 |
| JP | 2001-166478 A | 6/2001 |
| JP | 2001-194792 A | 7/2001 |
| JP | 2003-107707 A | 4/2003 |
| JP | 2003-107708 A | 4/2003 |
| JP | 2005-234434 A | 9/2005 |

\* cited by examiner

*Primary Examiner* — John S Chu
(74) *Attorney, Agent, or Firm* — Sughrue Mion, PLLC

(57) ABSTRACT

A positive resist composition for electron beam, X-ray or EUV exposure, including (A) a resin capable of decomposing by the action of an acid to increase the solubility in an alkali developer; and (B) a compound capable of generating a sulfonic acid upon irradiation with an actinic ray or radiation, wherein the resin (A) is a resin having a phenolic hydroxyl group and having a weight average molecular weight of 1,500 to 3,500, the positive resist composition has a property of decomposing by the action of an acid and causing the dissolution rate in an aqueous 2.38 wt % tetramethylammonium hydroxide solution at 23° C. under normal pressure to increase in a range of 200 to 5,000 times, and the positive resist composition has a solid content concentration of from 2.5 to 4.5 mass %.

6 Claims, No Drawings

POSITIVE RESIST COMPOSITION AND PATTERN FORMING METHOD USING THE SAME

BACKGROUND OF THE INVENTION

1. Field of the Invention

The present invention relates to a positive resist composition suitable for use in the ultramicrolithography process such as production of VLSI or a high-capacity microchip or in other photofabrication processes. More specifically, the present invention relates to a positive photoresist capable of forming a high-resolution pattern by using electron beam, X-ray or EUV, that is, a positive resist composition suitably usable for fine processing of a semiconductor device, and a pattern forming method using the same.

2. Description of the Related Art

In the process of producing a semiconductor device such as IC and LSI, fine processing by lithography using a photoresist composition has been conventionally performed. Recently, the integration degree of an integrated circuit is becoming higher and formation of an ultrafine pattern in the sub-micron or quarter-micron region is required. To cope with this requirement, the exposure wavelength also tends to become shorter, for example, from g line to i line or further to KrF excimer laser light. At present, other than the excimer laser light, development of lithography using electron beam, X ray or EUV light is proceeding.

The lithography using electron beam or EUV light is positioned as a next-generation or next-next-generation pattern formation technique and a high-sensitivity high-resolution resist is being demanded. Particularly, in order to shorten the wafer processing time, the elevation of sensitivity is very important, but when high sensitivity of a positive resist to electron beam or EUV is sought for, not only reduction in the resolution but also worsening of the iso/dense bias are incurred and development of a resist satisfying these properties at the same time is strongly demanded. The iso/dense bias as used herein means a difference in the pattern dimension between a high density portion and a low density portion of a resist pattern and when this difference is large, the process margin is disadvantageously narrowed at the actual pattern formation. How to reduce this difference is one of important problems to be solved in the resist technology development. The high sensitivity is in a trade-off relationship with high resolution, good pattern profile and good iso/dense bias and it is very important how to satisfy these properties at the same time.

In the actual field of semiconductor fine processing, the aging stability of the resist composition is a problem. Usually, in producing VLSI or a high-capacity microchip, there is employed a system of preparing and storing only a resist composition in a large amount and step-by-step using a necessary amount of the resist therefrom at the semiconductor fine processing. However, the conventional resist composition for electron beam or EUV undergoes a change in sensitivity with aging and this requires to vary the exposure amount, development conditions and the like between when using a resist immediately after preparation and when using a resist at a later time after the preparation, which hampers mass production.

With respect to such a positive resist, there are conventionally known some resist compositions using a phenolic acid-decomposable resin obtained by copolymerizing an acid-decomposable acrylate monomer having an alicyclic group as the acid-decomposable group. Examples thereof include positive resist compositions disclosed in U.S. Pat. No. 5,561, 194, JP-A-2001-166474 (the term "JP-A" as used herein means an "unexamined published Japanese patent application"), JP-A-2001-166478, -A-2003-107708, JP-A-2001-194792 and JP-A-2005-234434. Also, a case using a compound capable of generating a sulfonic acid upon irradiation with an actinic ray or radiation and a compound capable of generating a carboxylic acid is disclosed in JP-A-2003-107707.

In these resist compositions using a low-molecular phenol compound as the main component, high dissolution contrast may be obtained but, on the other hand, there is a problem that the performances in terms of iso/dense bias and exposure margin are insufficient.

SUMMARY OF THE INVENTION

An object of the present invention is to solve the problems in the technology for enhancing the performance at the fine processing of a semiconductor device with use of electron beam, X-ray or EUV light and provide a positive resist composition assured of good aging stability of sensitivity and a pattern forming method using the composition.

The above-described object can be attained by a positive resist composition having the following constructions and a pattern forming method using the composition.

<1> A positive resist composition for electron beam, X-ray or EUV exposure, comprising (A) a resin capable of decomposing by the action of an acid to increase the solubility in an alkali developer and (B) a compound capable of generating a sulfonic acid upon irradiation with an actinic ray or radiation, wherein the resin (A) is a resin having a phenolic hydroxyl group and having a weight average molecular weight of 1,500 to 3,500, the positive resist composition has a property of decomposing by the action of an acid and causing the dissolution rate in an aqueous 2.38 wt % tetramethylammonium hydroxide solution at 23° C. under normal pressure to increase in a range of 200 to 5,000 times, and the positive resist composition has a solid content concentration of from 2.5 to 4.5 mass %.

<2> The positive resist composition for electron beam, X-ray or EUV exposure as described in <1> above, wherein the resin (A) comprises a structural unit derived from a hydroxystyrene and a structural unit derived from a derivative of a hydroxystyrene.

<3> The positive resist composition for electron beam, X-ray or EUV exposure as described in <1> or <2> above, wherein the resin (A) has a glass transition temperature Tg of from 100 to 150° C.

<4> A pattern forming method comprising forming a resist film from the positive resist composition described in any one of <1> to <3> above, and subjecting the resist film to exposure with electron beam, X-ray or EUV and development.

DETAILED DESCRIPTION OF THE INVENTION

The compounds for use in the present invention are described in detail below.

Incidentally, in the context of the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

[1] (A) Resin Capable of Decomposing by the Action of an Acid to Increase the Solubility in an Alkali Developer The resin (A) for use in the present invention is a resin having a phenolic hydroxyl group and having a weight average molecular weight of 1,500 to 3,500, and this is a resin having a property of being insoluble or sparingly soluble in an alkali developer but decomposing by the action of an acid to increase the solubility in an alkali developer and becoming soluble, that is, an acid-decomposable resin.

The resin composition of the present invention has a property of decomposing by the action of an acid and causing the dissolution rate in an aqueous 2.38 wt % tetramethylammonium hydroxide solution at 23° C. under normal pressure to increase in the range of 200 to 5,000 times.

The decomposition●solubility of the positive resist composition is greatly affected by the property of the resin mainly constituting the composition and therefore, a resist composition having the above-described property is obtained by using, as the acid-decomposable resin (A), a resin having a property of decomposing by the action of an acid and causing the dissolution rate in an aqueous 2.38 wt % tetramethylammonium hydroxide solution at 23° C. under normal pressure to increase in the range of 200 to 5,000 times.

In a phenolic hydroxyl group-containing resin such as hydroxystyrene-based resin and novolak resin, decrease of the molecular weight is effective for the reduction of LWR, but when the molecular weight is decreased, the dissolution rate in the exposed area becomes excessively high and this causes a problem that round top formation or film loss readily occurs or the iso/dense bias is worsened due to excessive diffusion of the acid generated from the acid generator. In the present invention, this problem is overcome by setting the dissolution contrast to the above-described range.

The ratio of the dissolution rate increased corresponds to the difference in the dissolution rate between the exposed area and the unexposed area (dissolution contrast) when developed after pattern exposure.

In the present invention, the difference in the dissolution rate in an aqueous 2.38 wt % tetramethylammonium hydroxide solution, which is a typical alkali developer, at 23° C. under normal pressure (1 atm) is used as the indicator.

The dissolution rate of the resin (A) increases, under the above-described conditions, in the range of 200 to 5,000 times, preferably from 300 to 2,000 times, more preferably from 500 to 1,000 times.

The resin having such a dissolution contrast can be obtained by controlling the hydrophilicity/hydrophobicity of the polymer main chain and appropriately adjusting the molecular weight and molecular weight distribution.

In the present invention, for formulating the resist composition to have a property of decomposing by the action of an acid and causing the dissolution rate in an aqueous 2.38 wt % tetramethylammonium hydroxide solution at 23° C. under normal pressure to increase in the range of 200 to 5,000 times, this needs to be achieved by setting the weight average molecular weight of the resin for use in the present invention to be from 1,500 to 3,500. Along with decease in the molecular weight of the resin, the dissolution rate increases, but in this case, the dissolution rate increases similarly in both the unexposed area and the exposed area and therefore, the ratio in the dissolution rate between the unexposed area and the exposed area is fundamentally unchanged. However, it is found that when the weight average molecular weight is from 1,500 to 3,500, a difference of 200 to 5,000 times is created in the dissolution rate between the unexposed area and the exposed area by effecting protection with an acid-dissociable dissolution-suppressing group such that the dissolution rate of the unexposed area becomes not more than the substantially necessary range (about 10 nm/min).

The resin that becomes soluble in an alkali developer by the action of an acid is, for example, a resin having a acetal/ketal structure as represented by formula (II) described later.

The resin (A) is a resin having a group (acid-decomposable group) capable of decomposing by the action of an acid to produce an alkali-soluble group, in ether one or both of the main chain and the side chain of the resin. Of these, a resin having an acid-decomposable group in the side chain is preferred.

The acid-decomposable group is a group obtained by protecting an alkali-soluble group with a group capable of decomposing and leaving by the action of an acid.

Examples of the alkali-soluble group include a group having a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group or a tris(alkylsulfonyl)methylene group.

Among these alkali-soluble groups, a carboxylic acid group, a fluorinated alcohol group (preferably hexafluoroisopropanol) and a sulfonic acid group are preferred.

As for the group capable of decomposing by the action of an acid (acid-decomposable groups), a group obtained by substituting the hydrogen atom of the above-described alkali-soluble group by a group capable of leaving by the action of an acid is preferred.

Examples of the acid capable of leaving by the action of an acid include —$C(R_{36})(R_{37})(R_{38})$, —$C(R_{36})(R_{37})(OR_{39})$ and —$C(R_{01})(R_{02})(OR_{39})$.

In the formulae, each of $R_{36}$ to $R_{39}$ independently represents an alkyl group, a cycloalkyl group, an aryl group, an aralkyl group or an alkenyl group. $R_{36}$ and $R_{37}$ may be bonded with each other to form a ring.

Each of $R_{01}$ and $R_{02}$ independently represents a hydrogen atom, an alkyl group, a cycloalkyl group, an aryl group, an aralkyl group or an alkenyl group.

The acid-decomposable group is preferably a cumyl ester group, an enol ester group, an acetal ester group, a tertiary alkyl ester group or the like, more preferably a tertiary alkyl ester group.

The group preferred as the acid-decomposable group is a group obtained by substituting the hydrogen atom of an alkali-soluble group such as —COOH group and —OH group by a group capable of leaving by the action of an acid.

In the present invention, the acid-decomposable group is preferably an acetal group or a tertiary ester group.

In the case where such a group capable of decomposing by the action of an acid is bonded as a side chain, the matrix resin is an alkali-soluble resin having a —OH or —COOH group in the side chain. Examples thereof include an alkali-soluble resin described below.

From this standpoint, the alkali-soluble resin is preferably an alkali-soluble resin having a hydroxystyrene structural unit, such as o-, m- or p-poly(hydroxystyrene) and a copolymer thereof, hydrogenated poly(hydroxystyrene), halogen- or alkyl-substituted poly(hydroxystyrene), partially O-alkylated or O-acylated poly-(hydroxystyrene), styrene-hydroxystyrene copolymer, α-methylstyrene-hydroxystyrene copolymer and hydrogenated novolak resin; or an alkali-soluble resin containing a repeating unit having a carboxyl group such as (meth)acrylic acid and norbornene carboxylic acid.

Preferred examples of the repeating unit having an acid-decomposable group for use in the present invention include a tert-butoxycarbonyloxystyrene, a 1-alkoxyethoxystyrene and a tertiary alkyl(meth)acrylate. Among these, a 2-alkyl-2-adamantyl(meth)acrylate and a dialkyl(1-adamantyl)methyl (meth)acrylate are more preferred.

The component (A) for use in the present invention can be obtained by reacting a precursor of a group capable of decomposing by the action of an acid with an alkali-soluble resin or copolymerizing an alkali-soluble resin monomer bonded by a group capable of decomposing by the action of an acid with various monomers, and this is disclosed in European Patent 254853, JP-A-2-25850, JP-A-3-223860 and JP-A-4-251259.

The resin (A) preferably contains a repeating unit having an aromatic group and in particular, this is preferably a resin (A1) containing a structural unit derived from a hydroxystyrene or a derivative thereof, more preferably a copolymer of hydroxystyrene/hydroxystyrene protected by an acid-decomposable group, or a copolymer of hydroxystyrene/tertiary alkyl(meth)acrylate.

Specific examples of the resin (A1) are set forth below, but the present invention is not limited thereto.

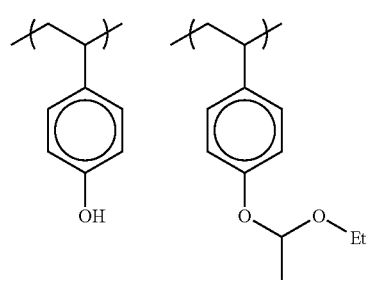

(R-1)

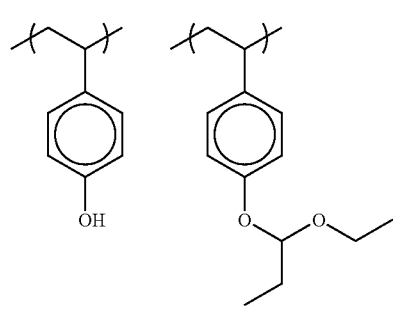

(R-2)

(R-3)

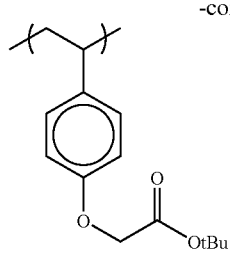

(R-4)

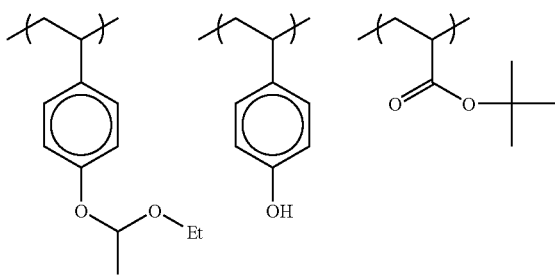

(R-5)

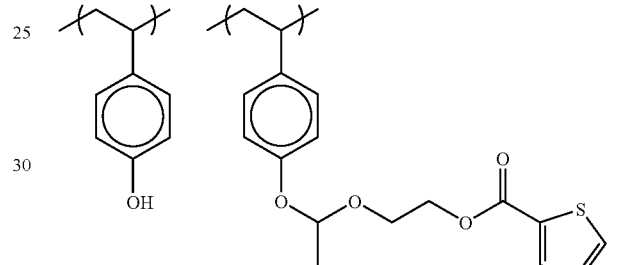

(R-6)

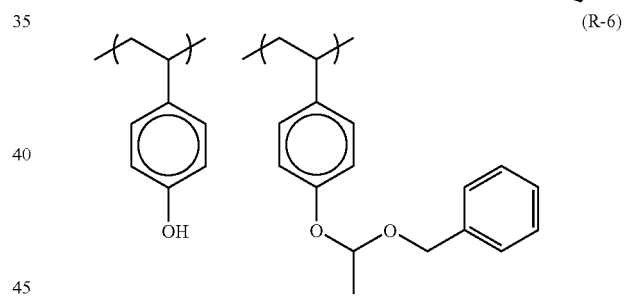

(R-7)

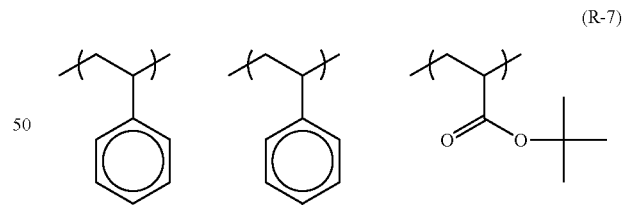

(R-8)

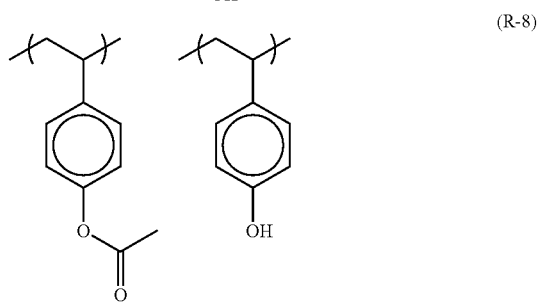

-continued
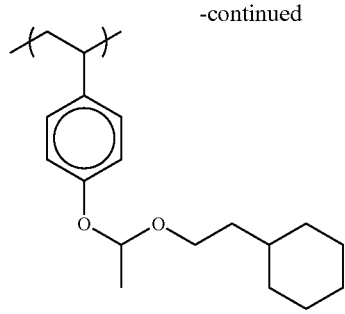
(R-9)
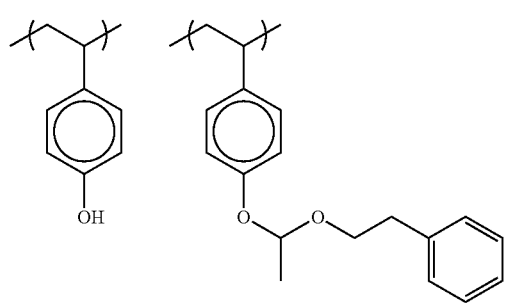
(R-10)
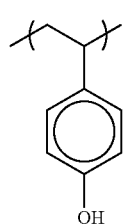
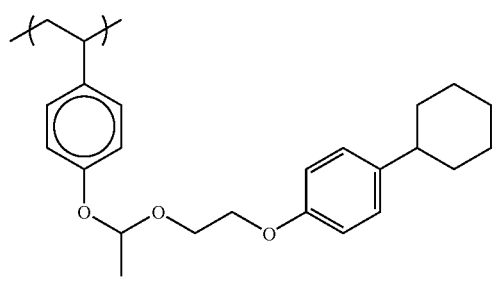
(R-11)
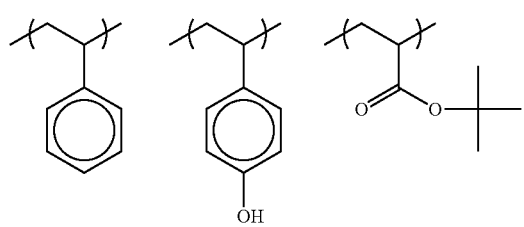
-continued
(R-12)
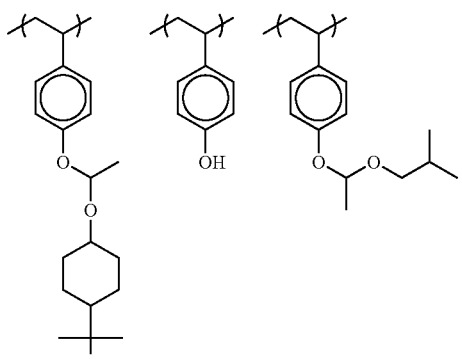
(R-13)
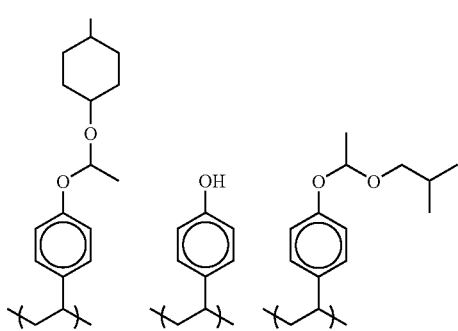
(R-14)
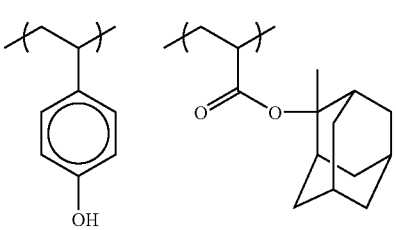
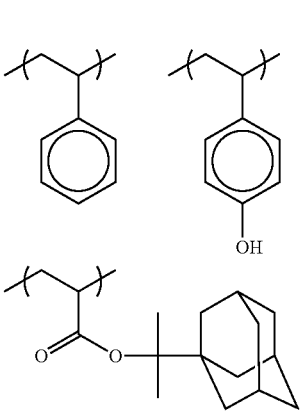
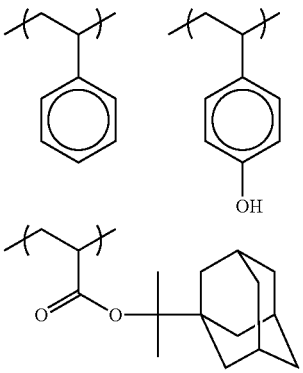
(R-15)
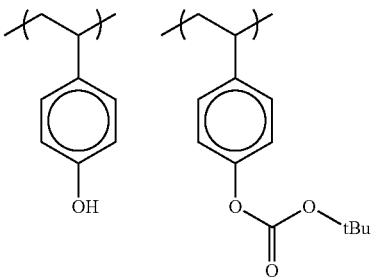

-continued

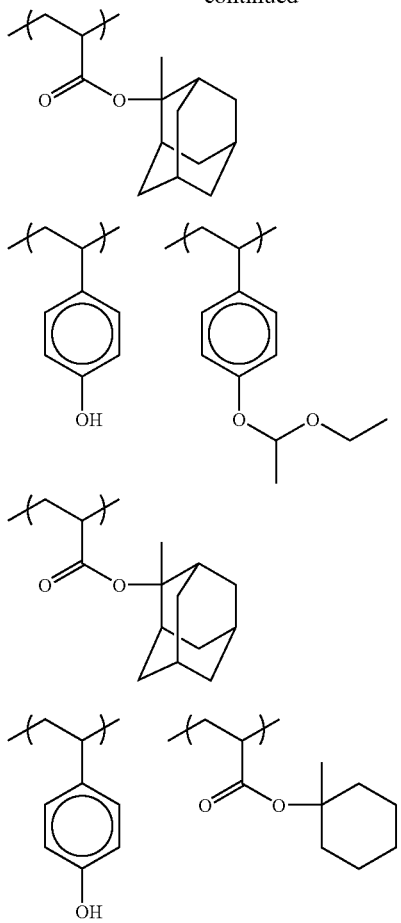

(R-16)

(R-17)

In specific examples above, tBu indicates a tert-butyl group.

The content of the group capable of decomposing by the action of an acid is expressed by B/(B+S) using the number (B) of groups capable of decomposing by the action of an acid and the number (S) of alkali-soluble groups not protected by a group capable of leaving by the action of an acid, in the resin. The content is preferably from 0.01 to 0.7, more preferably from 0.05 to 0.50, still more preferably from 0.05 to 0.40.

The resin (A1) containing a hydroxystyrene repeating unit is preferably a rein having a repeating unit represented by the following formula (II) and a repeating unit represented by formula (III).

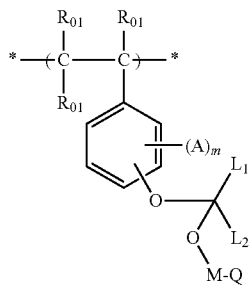

(II)

-continued

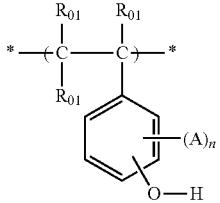

(III)

Each $R_{01}$ independently represents a hydrogen atom, an alkyl group, a cycloalkyl group, a halogen atom, a cyano group or an alkoxycarbonyl group.

Each of $L_1$ and $L_2$, which may be the same or different, represents a hydrogen atom, an alkyl group, a cycloalkyl group or an aralkyl group.

M represents a single bond or a divalent linking group.

Q represents an alkyl group, a cycloalkyl group or an alicyclic or aromatic ring group which may contain a heteroatom.

At least two members out of Q, M and $L_1$ may combine to form a 5- or 6-membered ring.

A represents a halogen atom, a cyano group, an acyl group, an alkyl group, an alkoxy group, an acyloxy group or an alkoxycarbonyl group.

Each of m and n independently represents an integer of 1 to 4, provided that m and n are preferably not 0 at the same time.

The resin (A1) containing a hydroxystyrene repeating unit may be a resin having a repeating unit represented by formula (II), a repeating unit represented by formula (III) and a repeating unit represented by formula (IV). In this case, m and n may be m=n=0.

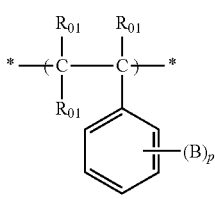

(IV)

Each $R_{01}$ independently represents a hydrogen atom, an alkyl group, a cycloalkyl group, a halogen atom, a cyano group or an alkoxycarbonyl group.

B represents a halogen atom, a cyano group, an acyl group, an alkyl group, an alkoxy group, an acyloxy group or an alkoxycarbonyl group.

p represents an integer of 0 to 5.

The substituent on the benzene ring in the repeating unit represented by formula (II) is a group (acid-decomposable group) capable of decomposing by the action of an acid to produce a hydroxyl group (alkali-soluble group) and decomposes by the action of an acid to produce a hydroxystyrene unit and convert the resin into a resin of which solubility in an alkali developer is increased.

Each $R_{01}$ independently represents a hydrogen atom, an alkyl group, a cycloalkyl group, a halogen atom, a cyano group or an alkoxycarbonyl group and preferably has a carbon number of 20 or less.

The alkyl group and cycloalkyl group in $R_{01}$ preferably have a carbon number of 20 or less, and examples thereof include a methyl group, an ethyl group, a propyl group, an isopropyl group, an n-butyl group, an isobutyl group, a tert-butyl group, a pentyl group, a cyclopentyl group, a hexyl group, a cyclohexyl group, an octyl group and a dodecyl group. These groups each may have a substituent, and examples of the substituent include an alkoxy group, a hydroxyl group, a halogen atom, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group and a heterocyclic residue such as pyrrolidone residue. The substituent preferably has a carbon number of 8 or less. A $CF_3$ group, an alkoxycarbonylmethyl group, an alkylcarbonyloxymethyl group, a hydroxymethyl group, an alkoxymethyl group and the like are more preferred.

The halogen atom in $R_{01}$ includes a fluorine atom, a chlorine atom, a bromine atom and an iodine atom and is preferably a fluorine atom.

As for the alkyl group contained in the alkoxycarbonyl group of $R_{01}$, the same as those described above for the alkyl group of $R_{01}$ are preferred.

The alkyl group as $L_1$ and $L_2$ is, for example, an alkyl group having a carbon number of 1 to 8, and specific preferred examples thereof include a methyl group, an ethyl group, a propyl group, an n-butyl group, a sec-butyl group, a hexyl group and an octyl group.

The cycloalkyl group as $L_1$ and $L_2$ is, for example, a cycloalkyl group having a carbon number of 3 to 15, and specific preferred examples thereof include a cyclopentyl group, a cyclohexyl group, a norbornyl group and an adamantyl group.

The aryl group as $L_1$ and $L_2$ is, for example, an aryl group having a carbon number of 6 to 15, and specific preferred example thereof include a phenyl group, a tolyl group, a naphthyl group and an anthryl group.

The aralkyl group as $L_1$ and $L_2$ is, for example, an aralkyl group having a carbon number of 6 to 20, and examples thereof include a benzyl group and a phenethyl group.

The divalent linking group as M is, for example, an alkylene group, a cycloalkylene group, an alkenylene group, an arylene group, —OCO—, —COO—, —CON($R_0$)— or a linking group containing a plurality of these members. $R_0$ is a hydrogen atom or an alkyl group.

The alkyl group and cycloalkyl group of Q are the same as the alkyl group and cycloalkyl group, respectively, of $L_1$ and $L_2$.

The alicyclic or aromatic ring group of Q, which may contain a heteroatom, includes, for example, the cycloalkyl group and aryl group of $L_1$ and $L_2$ and preferably has a carbon number of 3 to 15.

Examples of the heteroatom-containing alicyclic or aromatic ring group include thiirane, cyclothiolane, thiophene, furan, pyrrole, benzothiophene, benzofuran, benzopyrrole, triazine, imidazole, benzimidazole, triazole, thiadiazole, thiazole and pyrrolidone, but the heteroatom-containing alicyclic or aromatic ring group is not limited thereto as long as the ring is a structure generally called a hetero ring (a ring formed by carbon and heteroatom or a ring formed by heteroatom).

As for the 5- or 6-membered ring which may be formed by combining at least two members out of Q, M and $L_1$, there is included a case where at least two members out of Q, M and $L_1$ combine to form, for example, a propylene group or a butylene group, thereby forming a 5- or 6-membered ring containing an oxygen atom.

The group represented by —M-Q preferably has a carbon number of 1 to 30, more preferably from 5 to 20, and, for example, the group represented by —OC($L_1$)($L_2$)O—M-Q includes the followings.

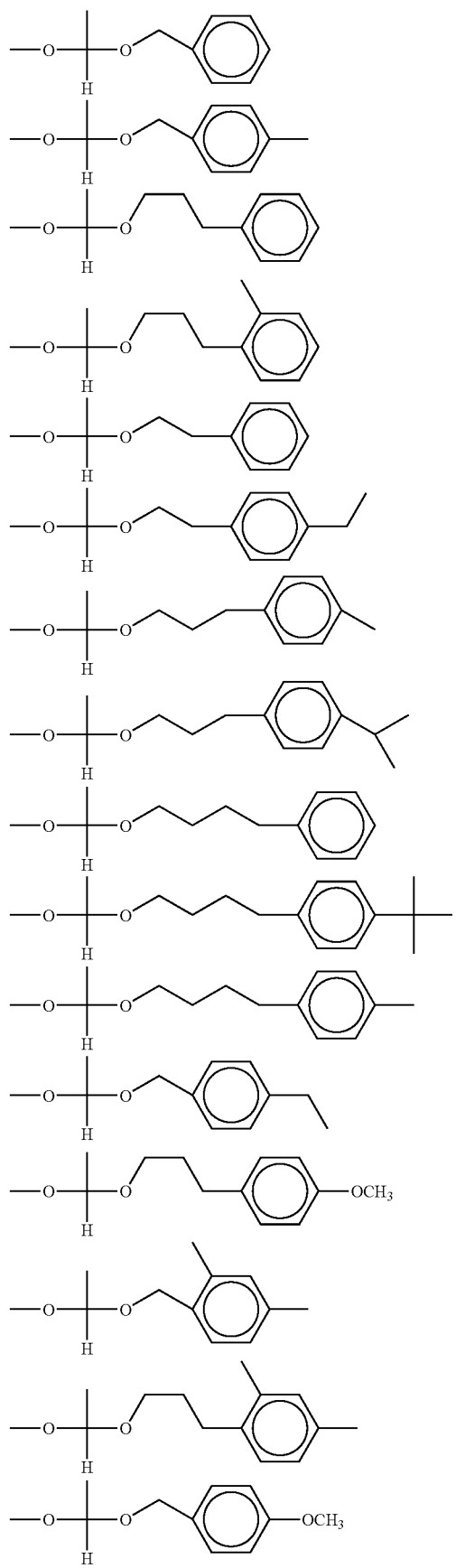

-continued

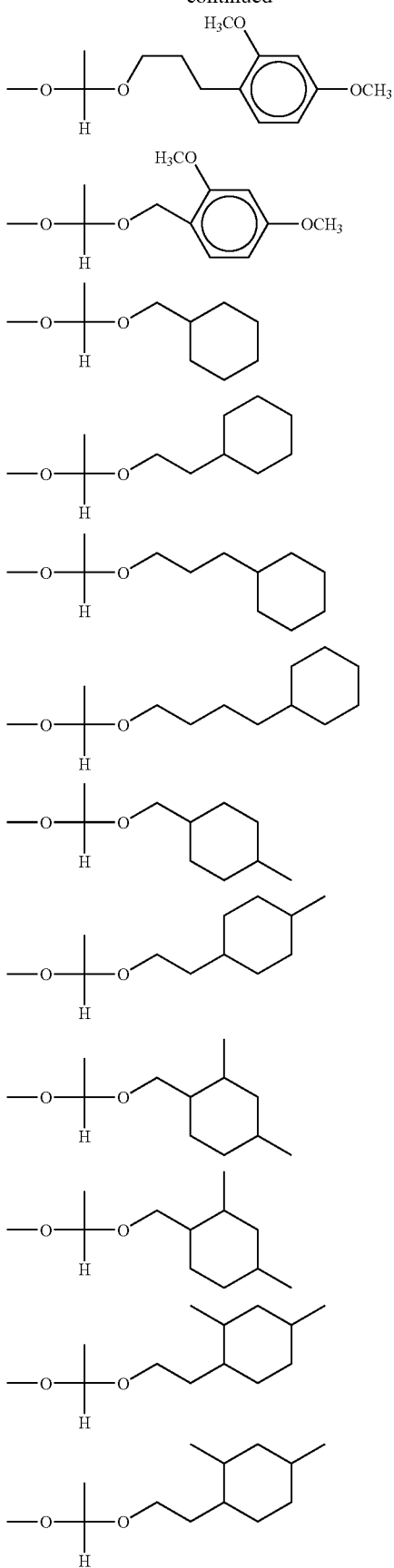

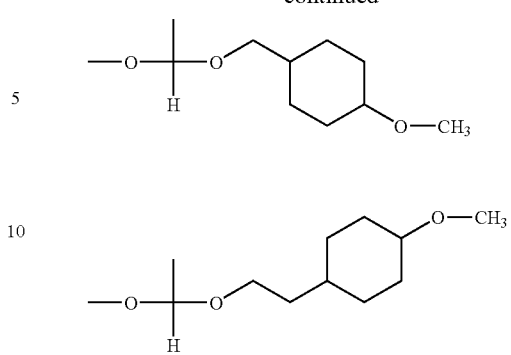

The acyl group as A is, for example, an acyl group having a carbon number of 2 to 8, and specific preferred examples thereof include a formyl group, an acetyl group, a propanoyl group, a butanoyl group, a pivaloyl group and a benzoyl group.

The alkyl group as A is, for example, an alkyl group having a carbon number of 1 to 8, and specific preferred examples thereof include a methyl group, an ethyl group, a propyl group, an n-butyl group, a sec-butyl group, a hexyl group and an octyl group.

The alkoxy group as A is, for example, the above-described alkoxy group having a carbon number of 1 to 8, and examples thereof include a methoxy group, an ethoxy group, a propoxy group, a butoxy group, a pentyloxy group, a hexyloxy group and a cyclohexyloxy group.

The acyloxy group or alkoxycarbonyl group as A includes groups corresponding to the above-described acyl group or alkoxy group.

These groups each may have a substituent, and preferred examples of the substituent include a hydroxyl group, a carboxyl group, a halogen atom (fluorine, chlorine, bromine, iodine) and an alkoxy group (e.g., methoxy, ethoxy, propoxy, butoxy). As for the cyclic structure, examples of the substituent further include an alkyl group (preferably having a carbon number of 1 to 8).

Each of m and n independently represents an integer of 0 to 4. Each of m and n is preferably an integer of 0 to 2, more preferably 1.

Specific examples of the repeating unit represented by formula (II) are set forth below, but the present invention is not limited thereto.

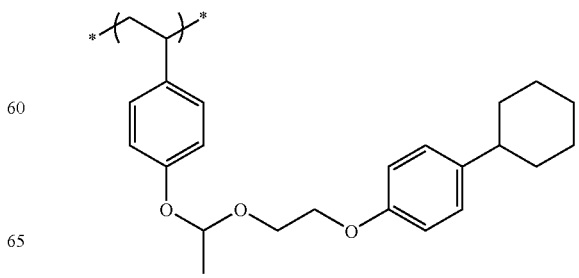

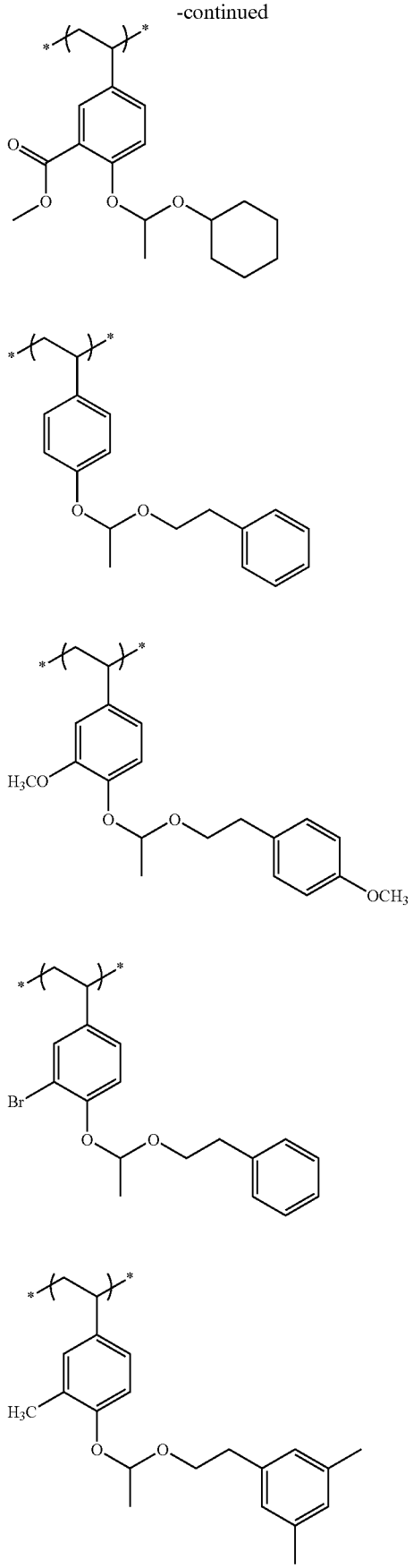
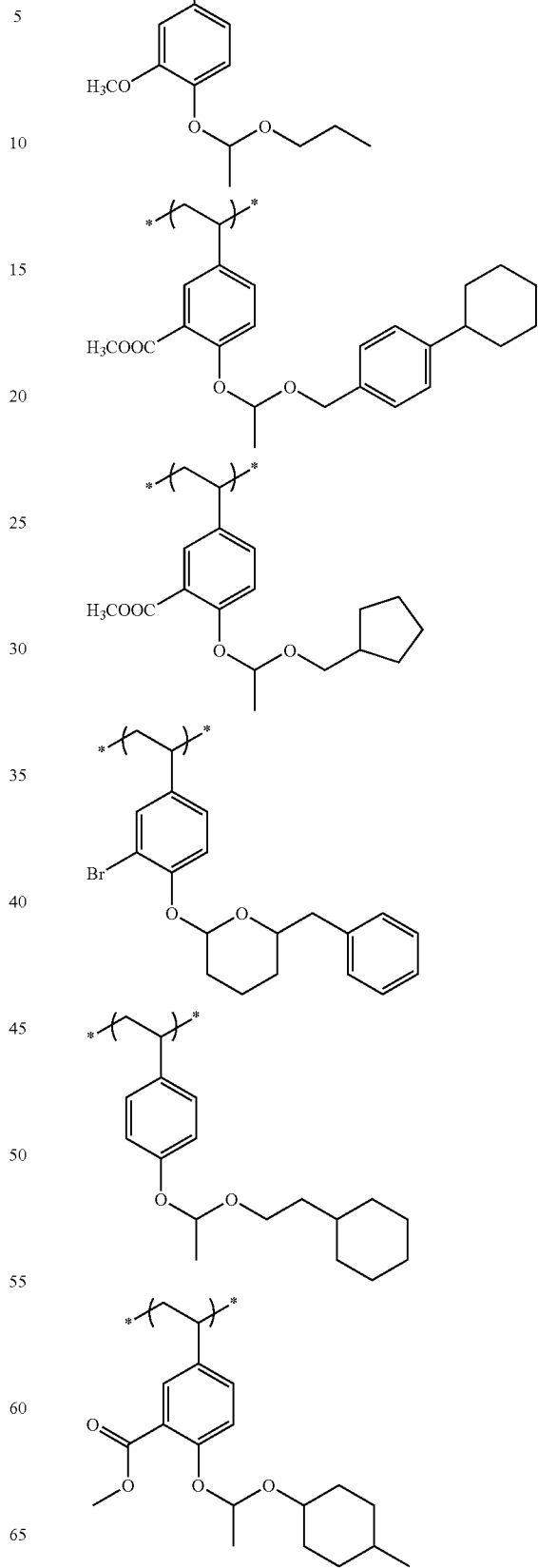

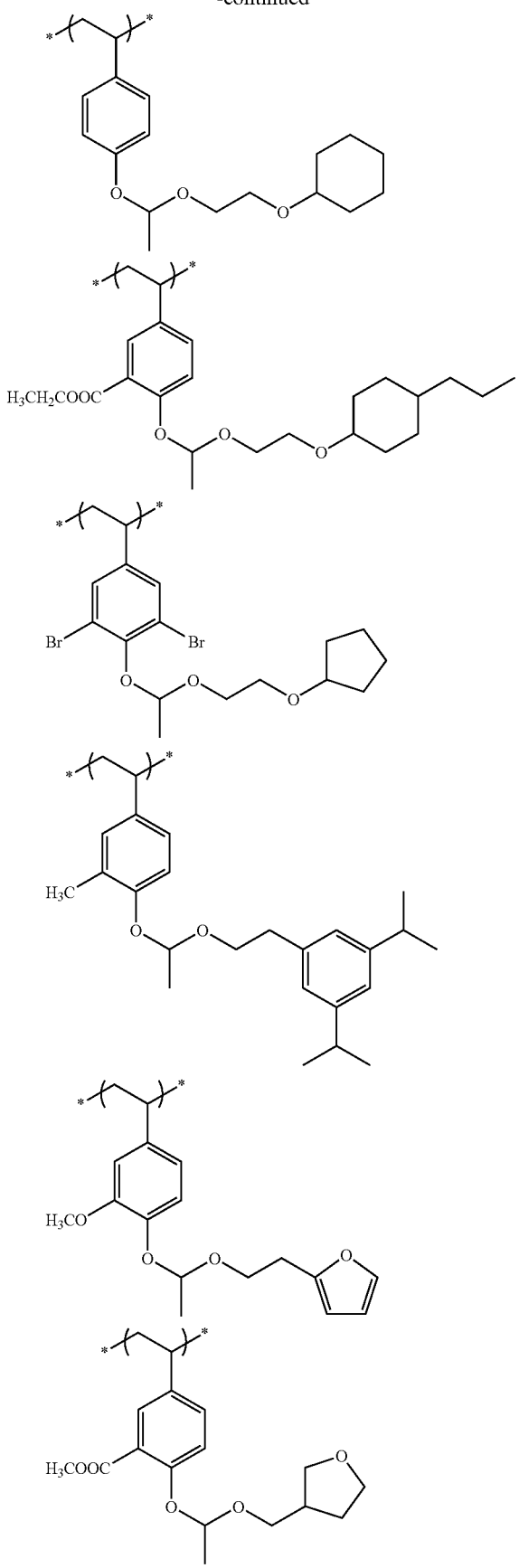
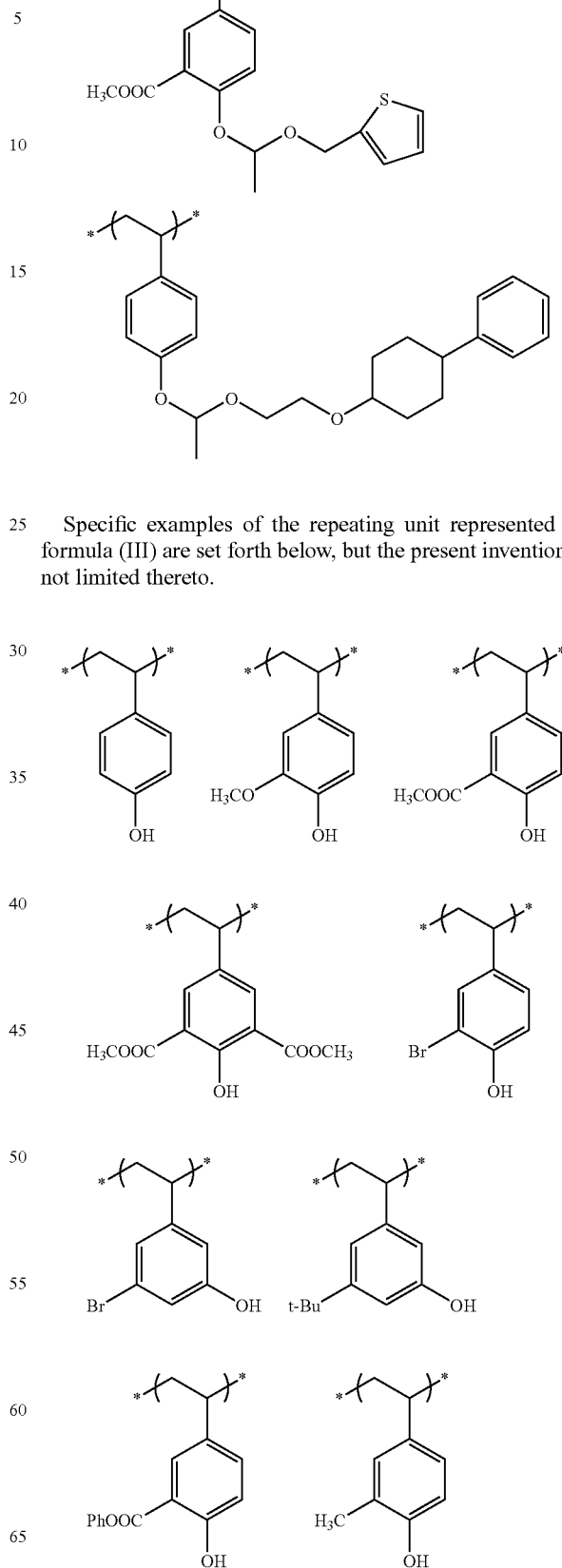
Specific examples of the repeating unit represented by formula (III) are set forth below, but the present invention is not limited thereto.

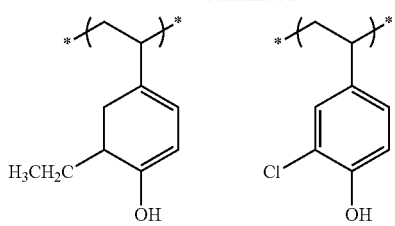

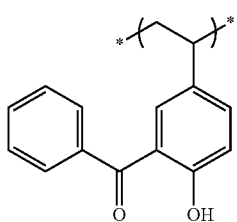

Each $R_{01}$ in formula (IV) independently represents a hydrogen atom, an alkyl group, a cycloalkyl group, a halogen atom, a cyano group or an alkoxycarbonyl group and preferably has a carbon number of 20 or less, and examples thereof are the same as those of $R_{01}$ in formula (II) or (III).

The acyl group, alkyl group, alkoxy group, acyloxy group and alkoxycarbonyl group as B in formula (IV) are the same as respective groups as A in formula (II).

p represents an integer of 1 to 5 and is preferably an integer of 0 to 2, more preferably 1.

Specific examples of the repeating unit represented by formula (IV) are set forth below, but the present invention is not limited thereto.

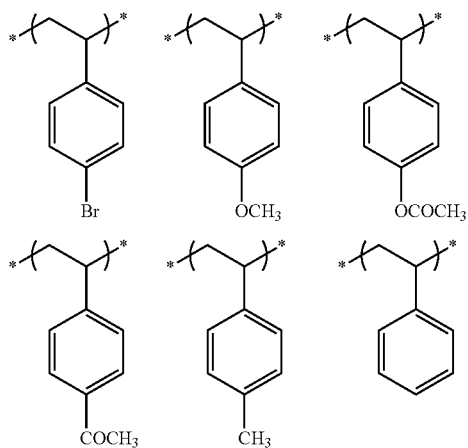

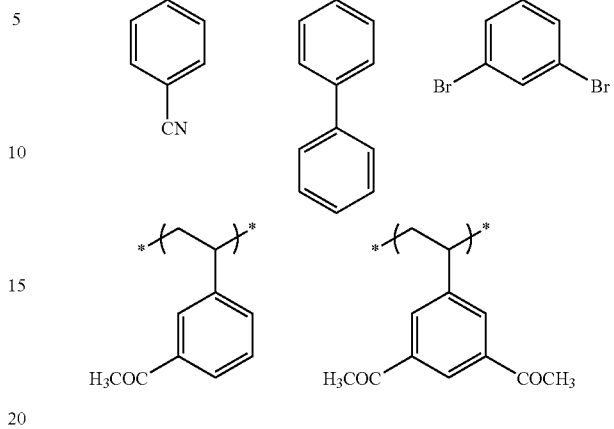

The resin (A) may contain a repeating unit represented by formula (V):

(V)

Each of Ra to Rc independently represents a hydrogen atom, a fluorine atom, a chlorine atom, a cyano group or an alkyl group.

$X_1$ represents a hydrogen atom or an organic group.

The alkyl group as Ra to Rc is preferably an alkyl group having a carbon number of 1 to 5, and examples thereof include a methyl group, an ethyl group and a propyl group.

The organic group as $X_1$ preferably has a carbon number of 1 to 40 and may be an acid-decomposable group or a non-acid-decomposable group.

Examples of the non-acid-decomposable group include an alkyl group, a cycloalkyl group, an alkenyl group and an aryl group.

In the non-acid-decomposable group, the alkyl group is preferably an alkyl group having a carbon number of 1 to 4, such as methyl group, ethyl group, propyl group, n-butyl group, sec-butyl group and tert-butyl group; the cycloalkyl group is preferably a cycloalkyl group having a carbon number of 3 to 10, such as cyclopropyl group, cyclobutyl group, cyclohexyl group and adamantyl group; the alkenyl group is preferably an alkenyl group having a carbon number of 2 to 4, such as vinyl group, propenyl group, allyl group and butenyl group; and the aryl group is preferably an aryl group having a carbon number of 6 to 14, such as phenyl group, xylyl group, toluyl group, cumenyl group, naphthyl group and anthracenyl group.

Examples of the organic group of $X_1$, which is an acid-decomposable group, include —C($R_{11a}$)($R_{12a}$)($R_{13a}$), —C($R_{14a}$)($R_{15a}$)(O$R_{16a}$) and —CO—OC($R_{11a}$)($R_{12a}$) ($R_{13a}$).

Each of $R_{11a}$ to $R_{13a}$ independently represents an alkyl group, a cycloalkyl group, an alkenyl group, an aralkyl group or an aryl group. Each of $R_{14a}$ and $R_{15a}$ independently represents a hydrogen atom or an alkyl group. $R_{16a}$ represents an alkyl group, a cycloalkyl group, an alkenyl group, an aralkyl group or an aryl group. Two members out of $R_{11a}$, $R_{12a}$ and $R_{13a}$, or two members out of $R_{14a}$, $R_{15a}$ and $R_{16a}$ may combine to form a ring.

Also, a group having an acid-decomposable group may be introduced into $X_1$ by modification. $X_1$ having introduced thereinto an acid-decomposable group is, for example, represented by the following formula:

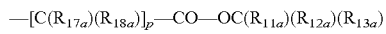

—[C($R_{17a}$)($R_{18a}$)]$_p$—CO—OC($R_{11a}$)($R_{12a}$)($R_{13a}$)

wherein each of $R_{17a}$ and $R_{18a}$ independently represents a hydrogen atom or an alkyl group, and p represents an integer of 1 to 4.

The organic group as $X_1$ is preferably an acid-decomposable group having at least one cyclic structure selected from an alicyclic structure, an aromatic cyclic structure and a crosslinked alicyclic structure, and the structure is preferably a structure containing an aromatic group (particularly phenyl group) or a structure containing an alicyclic or crosslinked alicyclic structure represented by the following formulae (pI) to (pVI):

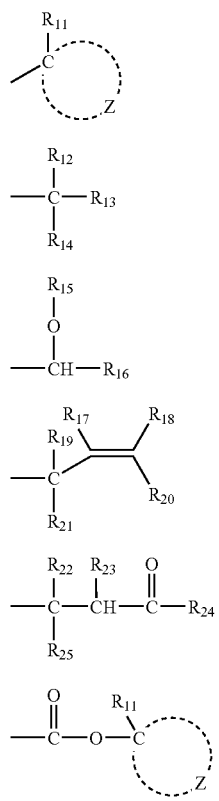

In formulae, $R_{11}$ represents a methyl group, an ethyl group, an n-propyl group, an isopropyl group, an n-butyl group, an isobutyl group or a sec-butyl group, and Z represents an atomic group necessary for forming an alicyclic hydrocarbon group together with the carbon atom.

Each of $R_{12}$ to $R_{16}$ independently represents a linear or branched alkyl group having a carbon number of 1 to 4 or an alicyclic hydrocarbon group, provided that at least one of $R_{12}$ to $R_{14}$ or either one of $R_{15}$ and $R_{16}$ represents an alicyclic hydrocarbon group.

Each of $R_{17}$ to $R_{21}$ independently represents a hydrogen atom, a linear or branched alkyl group having a carbon number of 1 to 4 or an alicyclic hydrocarbon group, provided that at least one of $R_{17}$ to $R_{21}$ represents an alicyclic hydrocarbon group and that either one of $R_{19}$ and $R_{21}$ represents a linear or branched alkyl group having a carbon number of 1 to 4 or an alicyclic hydrocarbon group.

Each of $R_{22}$ to $R_{25}$ independently represents a hydrogen atom, a linear or branched alkyl group having a carbon number of 1 to 4 or an alicyclic hydrocarbon group, provided that at least one of $R_{22}$ to $R_{25}$ represents an alicyclic hydrocarbon group, and $R_{23}$ and $R_{24}$ may combine with each other to form a ring.

In formulae (pI) to (pVI), the alkyl group of $R_{12}$ to $R_{25}$ is a linear or branched alkyl group having a carbon number of 1 to 4, which may be substituted or unsubstituted, and examples of the alkyl group include a methyl group, an ethyl group, an n-propyl group, an isopropyl group, an n-butyl group, an isobutyl group, a sec-butyl group and a tert-butyl group.

Examples of the substituent which the alkyl group may further have include an alkoxy group having a carbon number of 1 to 4, a halogen atom (fluorine, chlorine, bromine, iodine), an acyl group, an acyloxy group, a cyano group, a hydroxyl group, a carboxy group, an alkoxycarbonyl group and a nitro group.

The alicyclic hydrocarbon group of $R_{11}$ to $R_{25}$ and the alicyclic hydrocarbon group formed by Z together with the carbon atom may be monocyclic or polycyclic. Specific examples thereof include a group having a carbon number of 5 or more and having a monocyclo, bicyclo, tricyclo or tetracyclo structure. The carbon number thereof is preferably from 6 to 30, more preferably from 7 to 25. These alicyclic hydrocarbon groups each may have a substituent.

Examples of the structure of the alicyclic moiety in the alicyclic hydrocarbon group are set forth below.

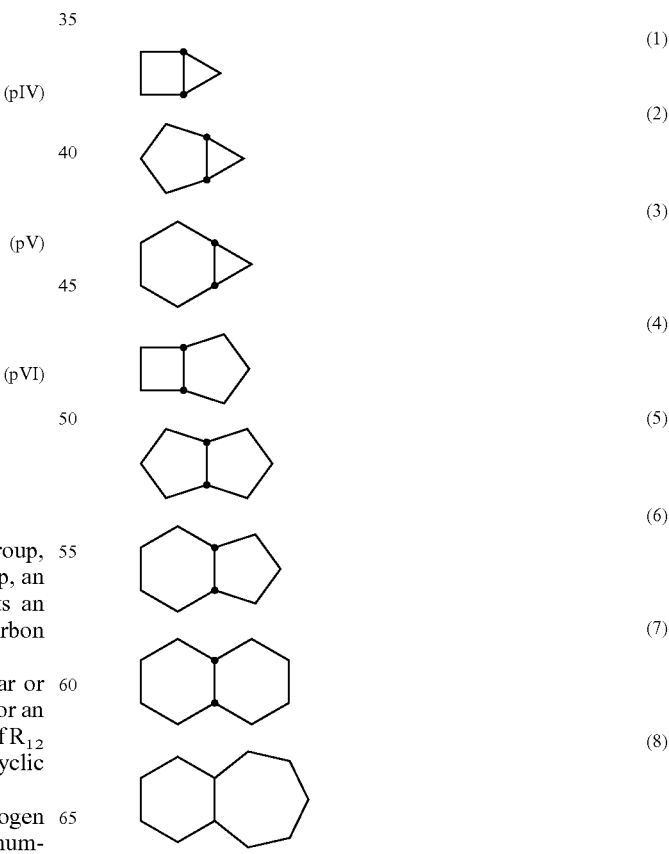

-continued
(9)
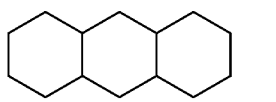
(10)
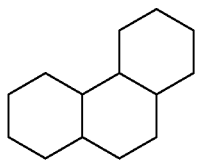
(11)
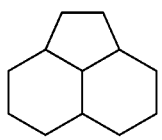
(12)
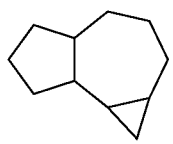
(13)
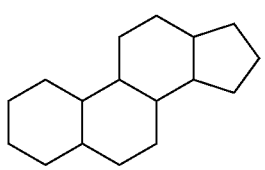
(14)
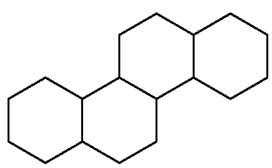
(15)
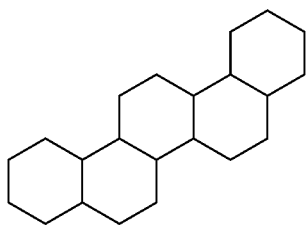
(16)
(17)
(18)
(19)
-continued
(20)
(21)
(22)
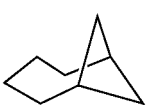
(23)
(24)
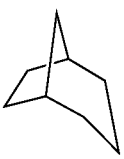
(25)
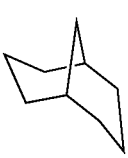
(26)
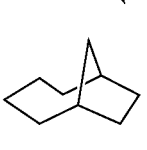
(27)
(28)
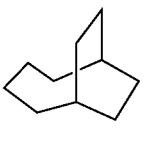
(29)
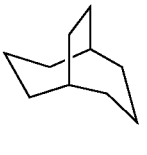
(30)
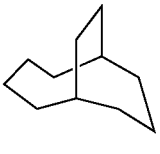
(31)

-continued

(32) 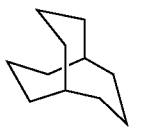

(33) 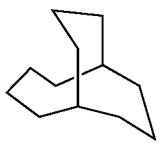

(34) 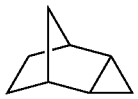

(35) 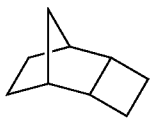

(36) 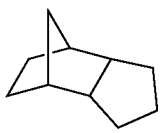

(37) 

(38) 

(39) 

(40) 

(41) 

(42) 

(43) 

(44) 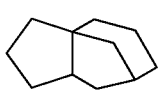

-continued

(45) 

(46) 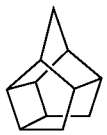

(47) 

(48) 

(49) 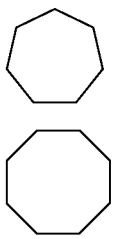

(50) 

Among these alicyclic moieties, preferred in the present invention are an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group, more preferred are an adamantyl group, a decalin residue, a norbornyl group, a cedrol group, a cyclohexyl group, a cycloheptyl group, a cyclooctyl group, a cyclodecanyl group and a cyclododecanyl group.

Examples of the substituent which the alicyclic hydrocarbon group may have include an alkyl group, a halogen atom, a hydroxyl group, an alkoxy group, a carboxyl group and an alkoxycarbonyl group. The alkyl group is preferably a lower alkyl group such as methyl group, ethyl group, propyl group, isopropyl group and butyl group, more preferably a substituent selected from the group consisting of a methyl group, an ethyl group, a propyl group and an isopropyl group. Examples of the alkoxy group include an alkoxy group having a carbon number of 1 to 4, such as methoxy group, ethoxy group, propoxy group and butoxy group.

The alkyl group, alkoxy group and alkoxycarbonyl group each may further have a substituent, and examples of the substituent include an alkoxy group having a carbon number of 1 to 4 (e.g., methoxy, ethoxy, butoxy), a hydroxy group, an oxo group, an alkylcarbonyl group (preferably having a carbon number of 2 to 5), an alkylcarbonyloxy group (preferably having a carbon number of 2 to 5), an alkyloxycarbonyl group (preferably having a carbon number of 2 to 5) and a halogen atom (e.g., chlorine, bromine, fluorine).

In the resin (A), for maintaining good developability with an alkali developer, another appropriate polymerizable monomer may be copolymerized so that an alkali-soluble group such as phenolic hydroxyl group, carboxyl group, sulfonic acid group and hexafluoroisopropanol group (—C(CF$_3$)$_2$OH) can be introduced, or for enhancing the film property, another hydrophobic polymerizable monomer such as alkyl acrylate and alkyl methacrylate may be copolymerized.

The content of the repeating unit represented by formula (II) is preferably from 5 to 60 mol %, more preferably from 10 to 50 mol %, still more preferably from 10 to 40 mol %, based on all repeating units constituting the resin.

The content of the repeating unit represented by formula (III) is preferably from 40 to 90 mol %, more preferably from 45 to 80 mol %, still more preferably from 50 to 75 mol %, based on all repeating units constituting the resin.

The content of the repeating unit represented by formula (IV) is preferably from 5 to 50 mol %, more preferably from 10 to 40 mol %, still more preferably from 15 to 30 mol %, based on all repeating units constituting the resin.

The content of the repeating unit represented by formula (V) is preferably from 0 to 30 mol %, more preferably from 0 to 20 mol %, still more preferably from 0 to 10 mol %, based on all repeating units constituting the resin.

The content of the repeating unit having an alkali-soluble group such as hydroxyl group, carboxy group and sulfonic acid group is preferably from 1 to 99 mol %, more preferably from 3 to 95 mol %, still more preferably from 5 to 90 mol %, based on all repeating units constituting the resin.

The content of the repeating unit having an acid-decomposable group is preferably from 3 to 95 mol %, more preferably from 5 to 90 mol %, still more preferably from 10 to 85 mol %, based on all repeating units constituting the resin.

The resin may be synthesized by a known synthesis method, for example, as described in European Patent 254853, JP-A-2-258500, JP-A-3-223860 and JP-A-4-251259, a method of reacting a precursor of a group capable of decomposing by the action of an acid with an alkali-soluble resin or a method of copolymerizing a monomer having a group capable of decomposing by the action of an acid with various monomers.

The weight average molecular weight of the resin (A1) is, as a polystyrene-reduced value by the GPC method, preferably 5,000 or less, more preferably from 1,000 to 5,000, still more preferably from 1,500 to 4,000, yet still more preferably from 2,000 to 3,000.

The polydispersity (Mw/Mn) of the resin (A1) is preferably from 1.0 to 3.0, more preferably from 1.05 to 2.0, still more preferably from 1.1 to 1.7.

As for the resin (A1), two or more kinds of resins may be used in combination.

Specific examples of the resin (A1) are set forth below, but the present invention is not limited thereto.

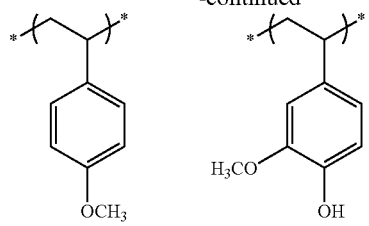
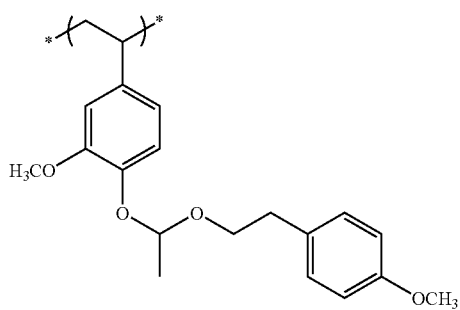
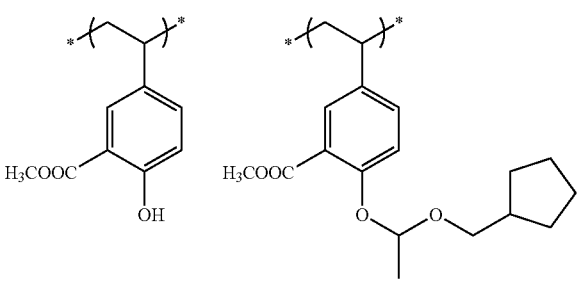
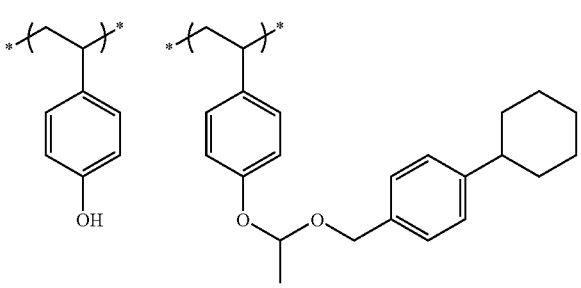
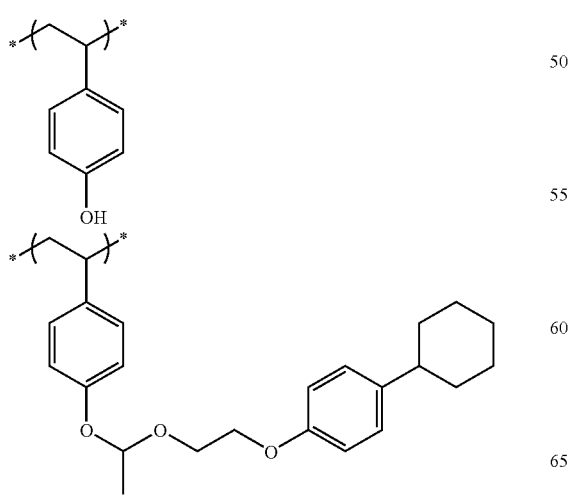

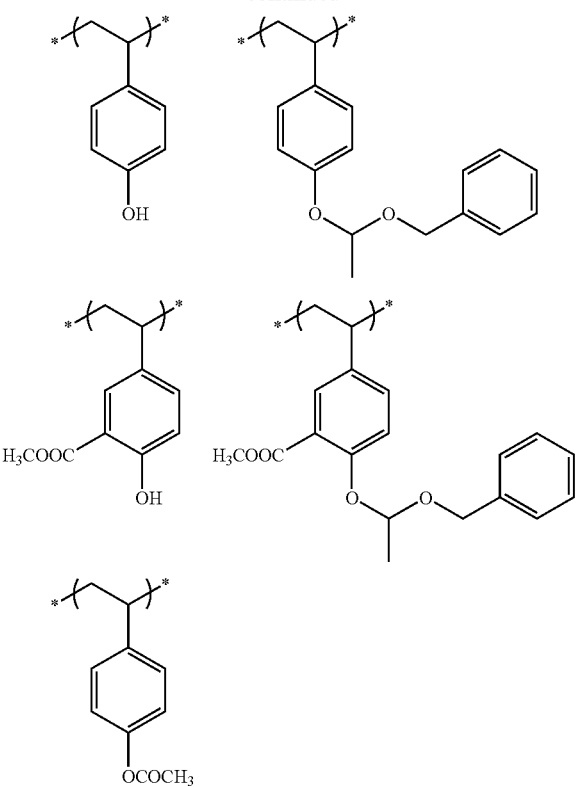

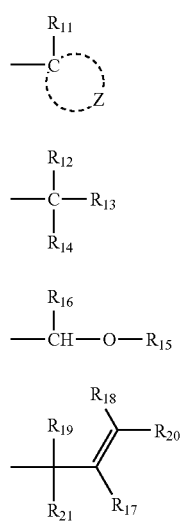

The resin (A2) having a monocyclic or polycyclic alicyclic hydrocarbon structure and being capable of decomposing by the action of an acid to increase the solubility in an alkali developer (hereinafter sometimes referred to as an "alicyclic hydrocarbon-based acid-decomposable resin") is preferably a resin containing at least one member selected from the group consisting of a repeating unit having a alicyclic hydrocarbon-containing partial structure represented by the following formulae (pI) to (pV) and a repeating unit represented by the following formula (II-AB).

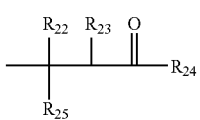

(pV)

In formulae (pI) to (pV), $R_{11}$ represents a methyl group, an ethyl group, an n-propyl group, an isopropyl group, an n-butyl group, an isobutyl group or a sec-butyl group. Z represents an atomic group necessary for forming a cycloalkyl group together with the carbon atom.

Each of $R_{12}$ to $R_{16}$ independently represents a linear or branched alkyl group having a carbon number of 1 to 4 or a cycloalkyl group, provided that at least one of $R_{12}$ to $R_{14}$ or either one of $R_{15}$ and $R_{16}$ represents a cycloalkyl group.

Each of $R_{17}$ to $R_{21}$ independently represents a hydrogen atom, a linear or branched alkyl group having a carbon number of 1 to 4 or a cycloalkyl group, provided that at least one of $R_{17}$ to $R_{21}$ represents a cycloalkyl group and that either one of $R_{19}$ and $R_{21}$ represents a linear or branched alkyl group having a carbon number of 1 to 4 or a cycloalkyl group.

Each of $R_{22}$ to $R_{25}$ independently represents a hydrogen atom, a linear or branched alkyl group having a carbon number of 1 to 4 or a cycloalkyl group, provided that at least one of $R_{22}$ to $R_{25}$ represents a cycloalkyl group. $R_{23}$ and $R_{24}$ may combine with each other to form a ring.

(II-AB)

In formula (II-AB), each of $R_{11}'$ and $R_{12}'$ independently represents a hydrogen atom, a cyano group, a halogen atom or an alkyl group.

Z' represents an atomic group for forming an alicyclic structure containing two bonded carbon atoms (C—C).

Formula (II-AB) is preferably the following formula (II-AB1) or (II-AB2):

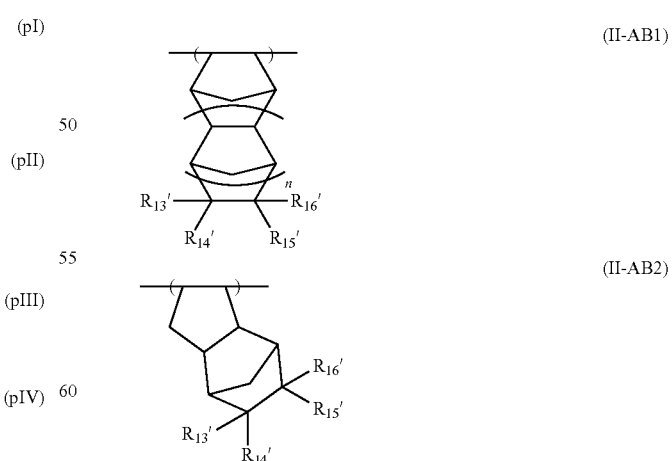

In formulae (II-AB1) and (II-AB2), each of $R_{13}'$ to $R_{16}'$ independently represents a hydrogen atom, a halogen atom, a cyano group, a hydroxyl group, —COOH, —COOR$_5$, a group capable of decomposing by the action of an acid, —C(=O)—X-A'-R$_{17}$', an alkyl group or a cycloalkyl group, and at least two members out of R$_{13}$' to R$_{16}$' may combine to form a ring.

R$_5$ represents an alkyl group, a cycloalkyl group or a group having a lactone structure.

X represents an oxygen atom, a sulfur atom, —NH—, —NHSO$_2$— or —NHSO$_2$NH—.

A' represents a single bond or a divalent linking group.

R$_{17}$' represents —COOH, —COOR$_5$, —CN, a hydroxyl group, an alkoxy group, —CO—NH—R$_6$, —CO—NH—SO$_2$—R$_6$ or a group having a lactone structure.

R$_6$ represents an alkyl group or a cycloalkyl group.

n represents 0 or 1.

In formulae (pI) to (pV), the alkyl group of R$_{12}$ to R$_{25}$ is a linear or branched alkyl group having a carbon number of 1 to 4, and examples thereof include a methyl group, an ethyl group, a propyl group, an n-butyl group, a sec-butyl group and a tert-butyl group.

The cycloalkyl group of R$_{11}$ to R$_{25}$ and the cycloalkyl group formed by Z together with the carbon atom may be monocyclic or polycyclic. Specific examples thereof include a group having a carbon number of 5 or more and having a monocyclo, bicyclo, tricyclo or tetracyclo structure or the like. The carbon number thereof is preferably from 6 to 30, more preferably from 7 to 25. These cycloalkyl groups each may have a substituent.

Preferred examples of the cycloalkyl group include an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group and a cyclododecanyl group. Among these, more preferred are an adamantyl group, a norbornyl group, a cyclohexyl group, a cyclopentyl group, a tetracyclododecanyl group and a tricyclodecanyl group.

The alkyl group and cycloalkyl group above each may further have a substituent. Examples of the substituent which the alkyl group and cycloalkyl group each may further have include an alkyl group (having a carbon number of 1 to 4), a halogen atom, a hydroxyl group, an alkoxy group (having a carbon number of 1 to 4), a carboxyl group and an alkoxycarbonyl group (having a carbon number of 2 to 6). These alkyl group, alkoxy group and alkoxycarbonyl group each may further have a substituent. Examples of the substituent which these alkyl group, alkoxy group, alkoxycarbonyl group and the like each may further have include a hydroxyl group, a halogen atom and an alkoxy group.

The structures represented by formulae (pI) to (pV) each can be used for the protection of an alkali-soluble group in the resin. Examples of the alkali-soluble group include various groups known in this technical field.

Specific examples thereof include a structure where the hydrogen atom of a carboxylic acid group, a sulfonic acid group, a phenol group or a thiol group is substituted by the structure represented by formulae (pI) to (pV). Among these, preferred is a structure where the hydrogen atom of a carboxylic acid group or a sulfonic acid group is substituted by the structure represented by formulae (pI) to (pV).

The repeating unit having an alkali-soluble group protected by the structure represented by formulae (pI) to (pV) is preferably a repeating unit represented by the following formula (pA):

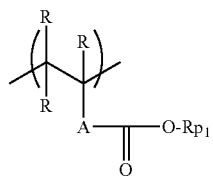

(pA)

In formula (pA), R represents a hydrogen atom, a halogen atom or a linear or branched alkyl group having a carbon number of 1 to 4, and each R may be the same as or different from every other R.

A represents a single bond, or a sole group or a combination of two or more groups selected from the group consisting of an alkylene group, an ether group, a thioether group, a carbonyl group, an ester group, an amido group, a sulfonamido group, a urethane group and a urea group. A is preferably a single bond.

Rp$_1$ represents a group represented by any one of formulae (pI) to (pV).

The repeating unit represented by formula (pA) is most preferably a repeating unit comprising a 2-alkyl-2-adamantyl (meth)acrylate or a dialkyl(1-adamantyl)methyl(meth)acrylate.

Specific examples of the repeating unit represented by formula (pA) are set forth below.

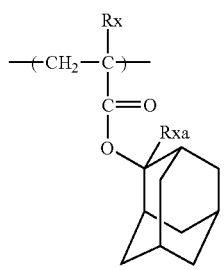

1

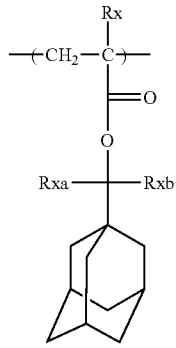

2

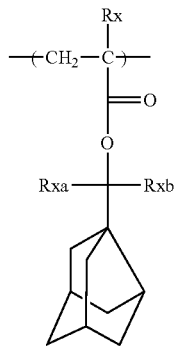

3

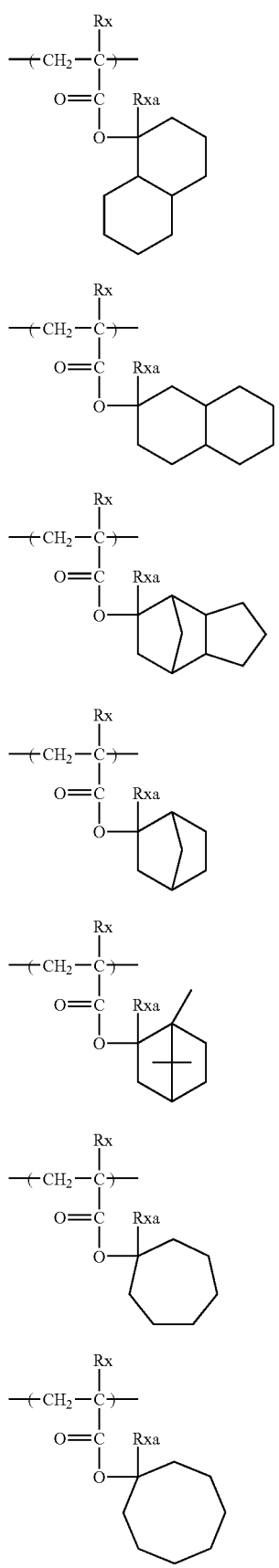
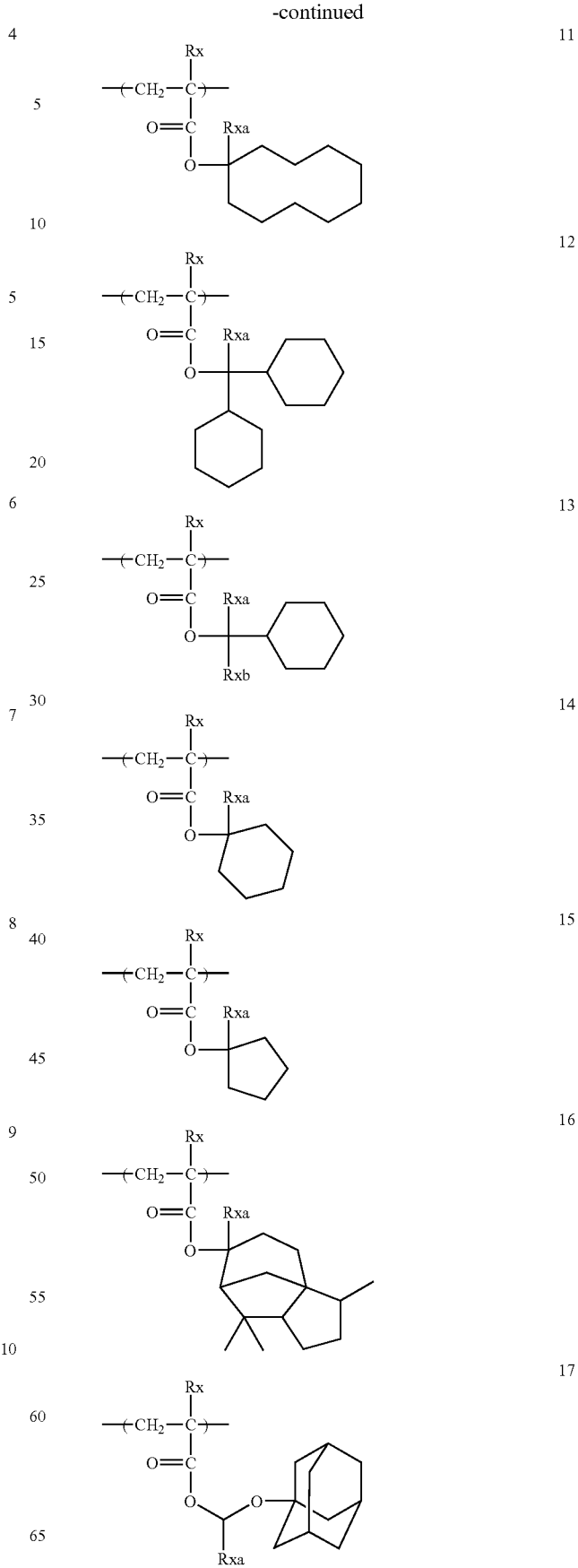

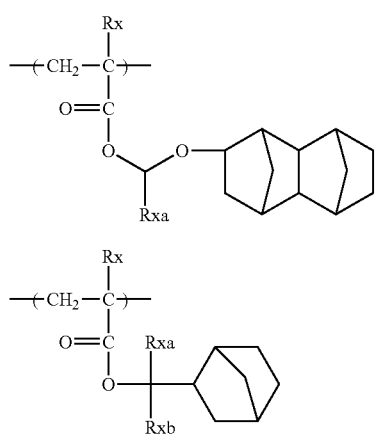

In the formulae above, Rx represents H, CH$_3$, CF$_3$ or CH$_2$OH, and each of Rxa and Rxb independently represents an alkyl group having a carbon number of 1 to 4.

Examples of the halogen atom of R$_{11}$' and R$_{12}$' in formula (II-AB) include a chlorine atom, a bromine atom, a fluorine atom and an iodine atom.

The alkyl group of R$_{11}$' and R$_{12}$' is preferably a linear or branched alkyl group having a carbon number of 1 to 10, and examples thereof include a methyl group, an ethyl group, an n-propyl group, an isopropyl group, a linear or branched butyl group, a linear or branched pentyl group, a linear or branched hexyl group, and a linear or branched heptyl group.

The atomic group of Z' for forming an alicyclic structure is an atomic group for forming a repeating unit comprising an alicyclic hydrocarbon which may have a substituent, in the resin. Above all, an atomic group for forming a crosslinked alicyclic structure to form a crosslinked alicyclic hydrocarbon repeating unit is preferred.

Examples of the skeleton of the alicyclic hydrocarbon formed are the same as those of the cycloalkyl group of R$_{12}$ to R$_{25}$ in formulae (pI) to (pVI).

The skeleton of the alicyclic hydrocarbon may have a substituent, and examples of the substituent include R$_{13}$' to R$_{16}$' in formulae (II-AB1) and (II-AB2).

In the resin (A2), the group capable of decomposing by the action of an acid may be contained in at least one repeating unit out of the repeating unit having an alicyclic hydrocarbon-containing partial structure represented by formulae (pI) to (pV), the repeating unit represented by formula (II-AB), and the repeating unit comprising a copolymerization component described later.

Various substituents R$_{13}$' to R$_{16}$' in formulae (II-AB1) and (II-AB2) may become substituents of the atomic group Z' for forming an alicyclic structure or a crosslinked alicyclic structure in formula (II-AB).

Specific examples of the repeating units represented by formulae (II-AB1) and (II-AB2) are set forth below, but the present invention is not limited to these specific examples.

[II-1]

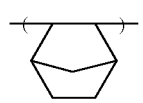

[II-2]

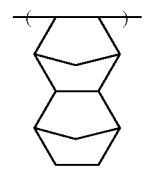

[II-3]

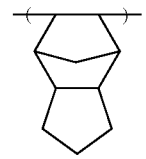

[II-4]

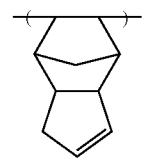

[II-5]

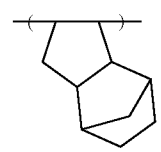

[II-6]

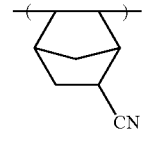

[II-7]

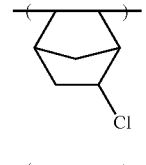

[II-8]

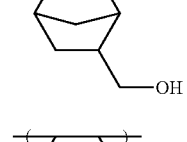

[II-9]

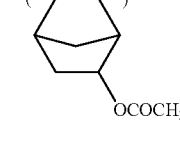

[II-10]

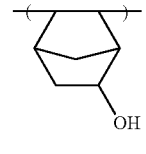

[II-11]

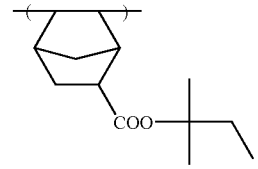

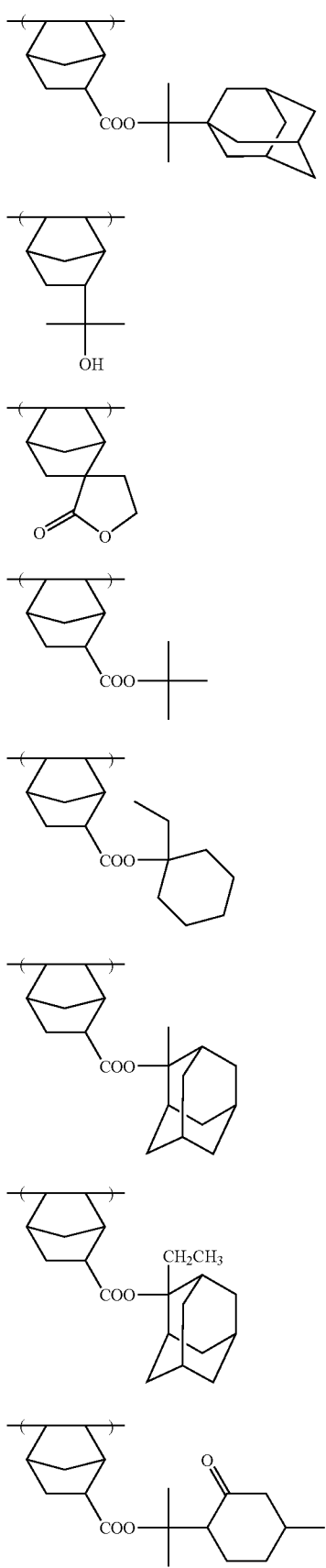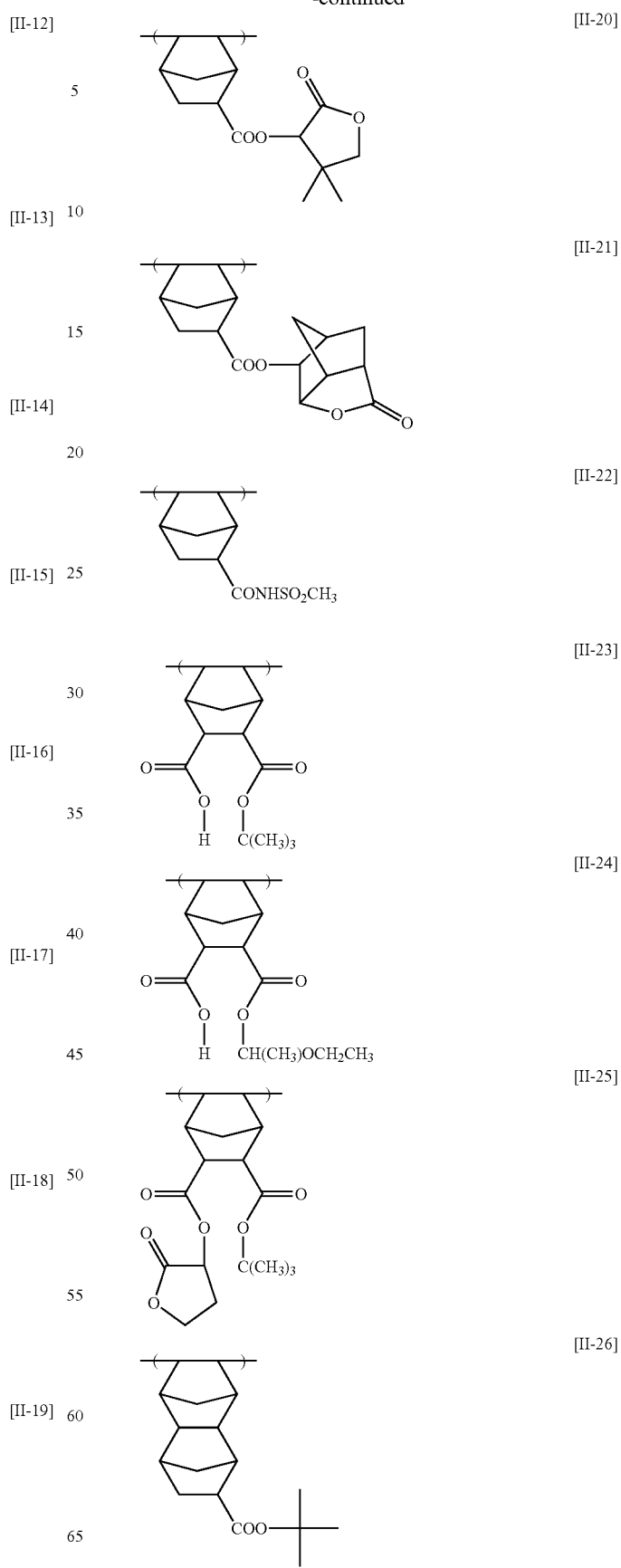

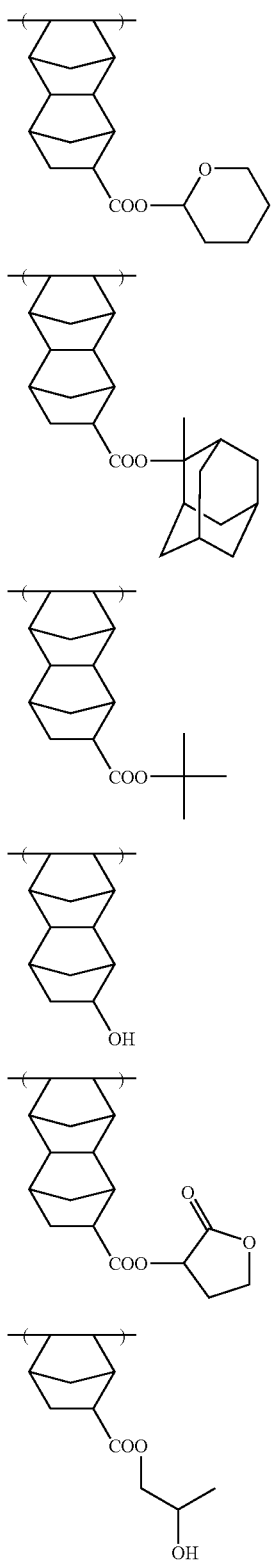

condensed with another ring structure in the form of forming a bicyclo or spiro structure. The alicyclic hydrocarbon-based acid-decomposable resin for use in the present invention more preferably contains a repeating unit containing a group having a lactone structure represented by any one of the following formulae (LC1-1) to (LC1-16). The group having a lactone structure may be bonded directly to the main chain. Among these lactone structures, preferred are (LC1-1), (LC1-4), (LC1-5), (LC1-6), (LC1-13) and (LC1-14). By virtue of using a specific lactone structure, the line edge roughness and development defect are improved.

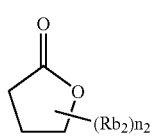

LC1-1

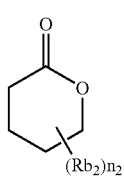

LC1-2

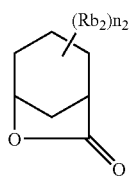

LC1-3

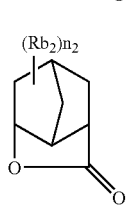

LC1-4

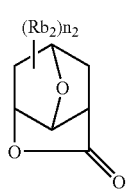

LC1-5

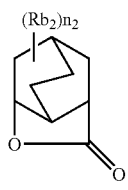

LC1-6

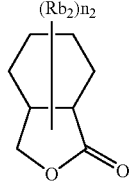

LC1-7

The resin (A2) preferably contains a repeating unit having a lactone group. As for the lactone group, any group may be used as long as it has a lactone structure, but a group having a 5- to 7-membered ring lactone structure is preferred. It is also preferred that the 5- to 7-membered ring lactone structure is -continued LC1-8
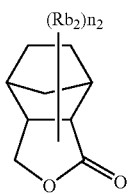

LC1-9
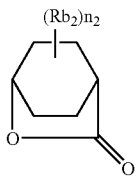

LC1-10
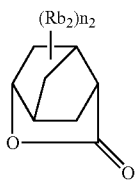

LC1-11
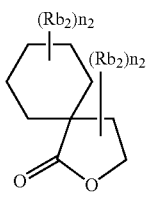

LC1-12
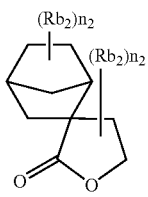

LC1-13
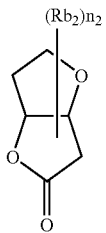

LC1-14
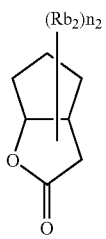

LC1-15

LC1-16
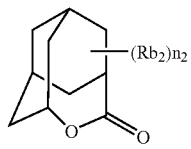

The lactone structure moiety may or may not have a substituent ($Rb_2$). Preferred examples of the substituent ($Rb_2$) include an alkyl group having a carbon number of 1 to 8, a cycloalkyl group having a carbon number of 3 to 7, an alkoxy group having a carbon number of 1 to 8, an alkoxycarbonyl group having a carbon number of 1 to 8, a carboxyl group, a halogen atom, a hydroxyl group, a cyano group and an acid-decomposable group. $n_2$ represents an integer of 0 to 4. When $n_2$ is an integer of 2 or more, each substituent $Rb_2$ may be the same as or different from every other $Rb_2$ and also, the plurality of substituents $Rb_2$ may combine with each other to form a ring.

Examples of the repeating unit containing a group having a lactone structure represented by any one of formulae (LC1-1) to (LC1-16) include a repeating unit where at least one of $R_{13}'$ to $R_{16}'$ in formula (II-AB1) or (II-AB2) has a group represented by formulae (LC1-1) to (LC1-16) (for example, $R_5$ of —$COOR_5$ is a group represented by formulae (LC1-1) to (LC1-16)), and a repeating unit represented by the following formula (A1):

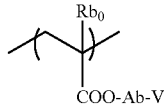

(AI)

In formula (A1), $Rb_0$ represents a hydrogen atom, a halogen atom or an alkyl group having a carbon number of 1 to 4.

Examples of the alkyl group of $Rb_0$ include a methyl group, an ethyl group, a propyl group, an n-butyl group, a sec-butyl group and a tert-butyl group. The alkyl group of $Rb_0$ may have a substituent. Preferred examples of the substituent which the alkyl group of $Rb_0$ may have include a hydroxyl group and a halogen atom.

The halogen atom of $Rb_0$ includes a fluorine atom, a chlorine atom, a bromine atom and an iodine atom. $Rb_0$ is preferably a hydrogen atom or a methyl group.

Ab represents an alkylene group, a divalent linking group having a monocyclic or polycyclic alicyclic hydrocarbon structure, a single bond, an ether group, an ester group, a carbonyl group, a carboxyl group, or a divalent group comprising a combination thereof, and is preferably a single bond or a linking group represented by -$Ab_1$-$CO_2$—.

$Ab_1$ represents a linear or branched alkylene group or a monocyclic or polycyclic cycloalkylene group and is preferably a methylene group, an ethylene group, a cyclohexyl residue, an adamantyl residue or a norbornyl residue.

V represents a group represented by any one of formulae (LC1-1) to (LC1-16).

The repeating unit having a lactone structure usually has an optical isomer, but any optical isomer may be used. One optical isomer may be used alone or a mixture of a plurality of optical isomers may be used. In the case of mainly using one optical isomer, the optical purity (ee) thereof is preferably 90 or more, more preferably 95 or more.

Specific examples of the repeating unit containing a group having a lactone structure are set forth below, but the present invention is not limited thereto.
(In the formulae, Rx is H, CH₃, CH₂OH or CF₃.)
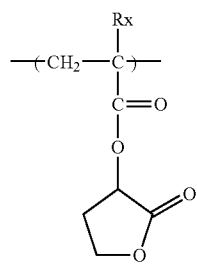 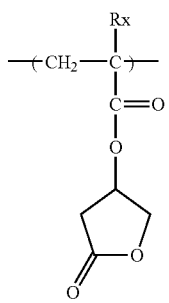
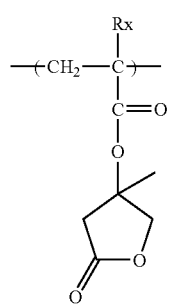 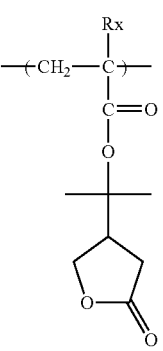
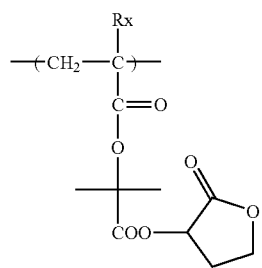 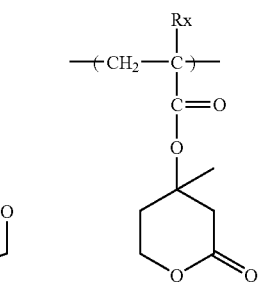
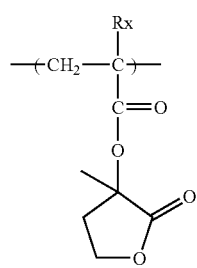 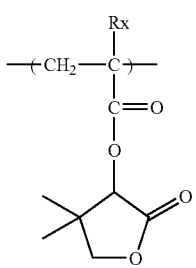
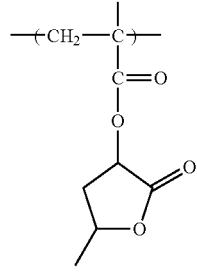 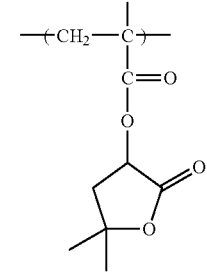
-continued
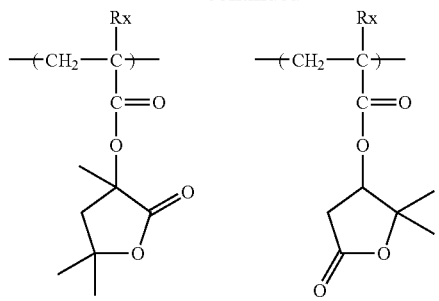
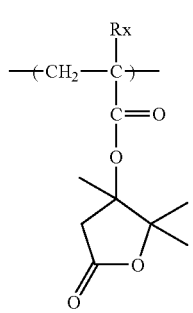 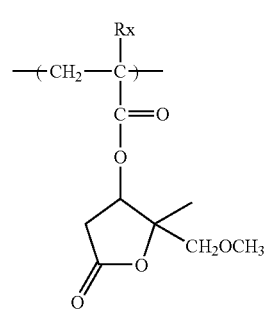
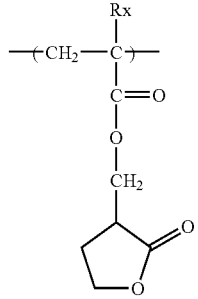 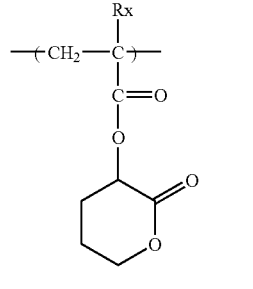
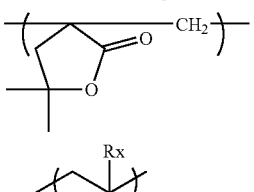
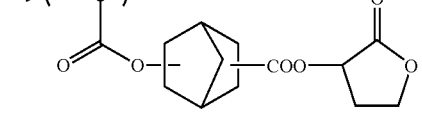
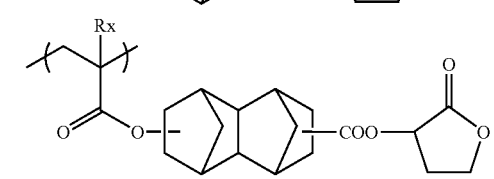
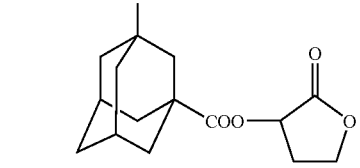

(In the formulae, Rx is H, CH₃, CH₂OH or CF₃.)
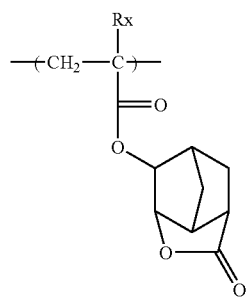
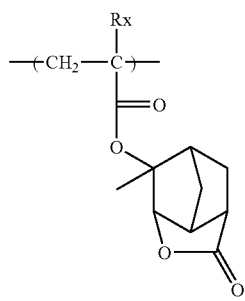
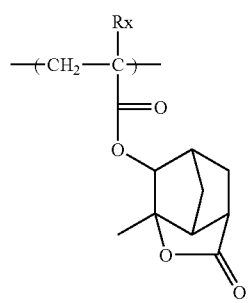
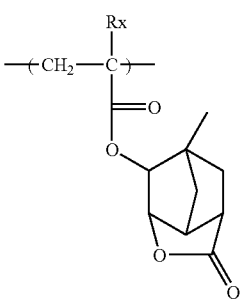
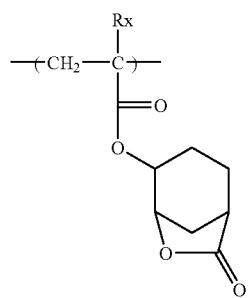
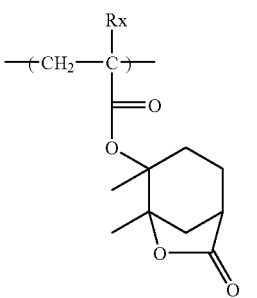
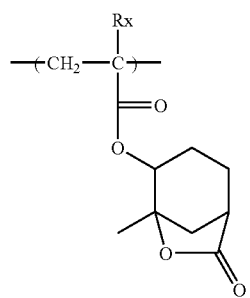
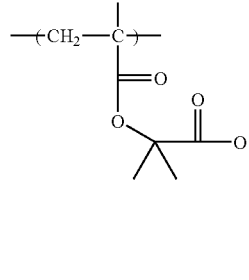
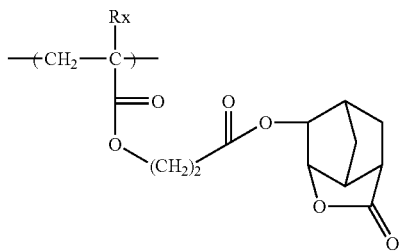
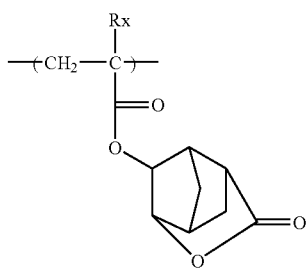
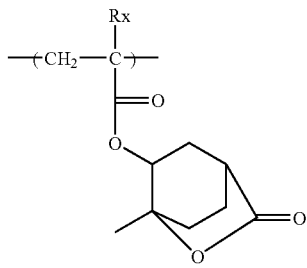
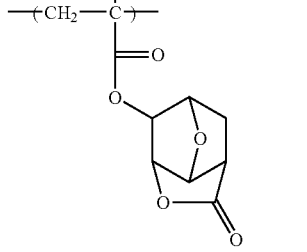
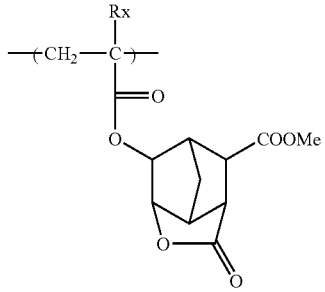
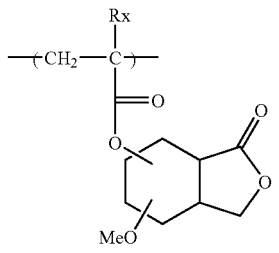

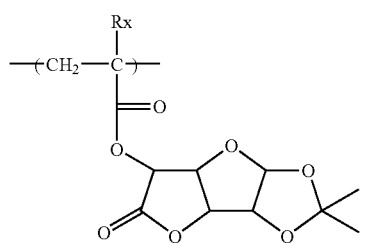
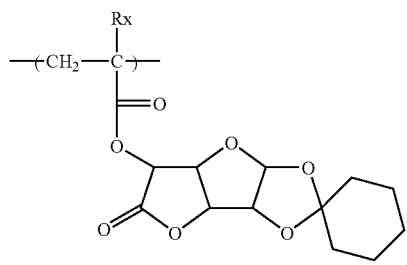
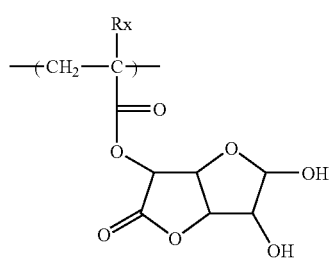

(In the formulae, Rx is H, CH₃, CH₂OH or CF₃.)

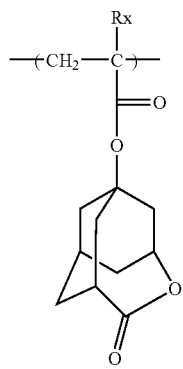
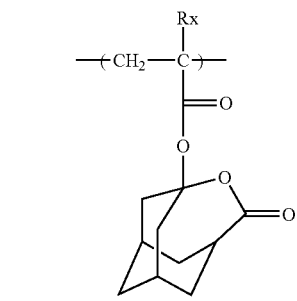
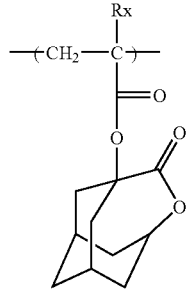
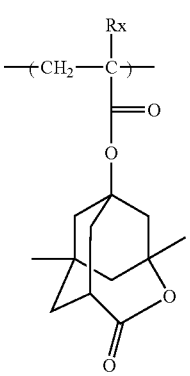

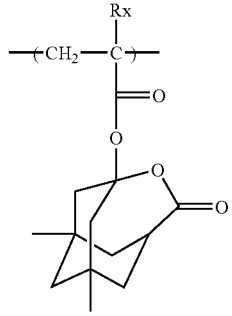
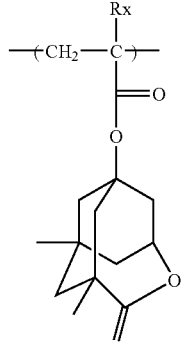
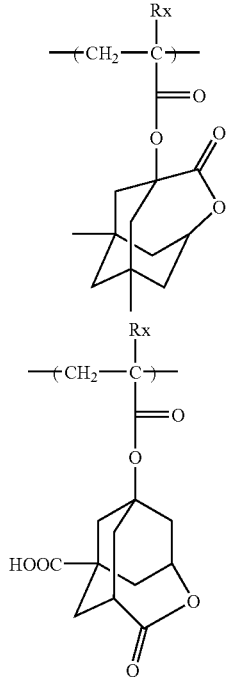
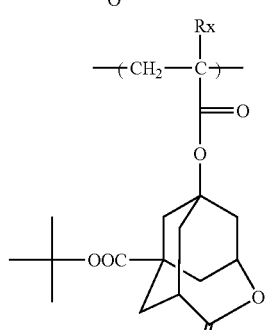
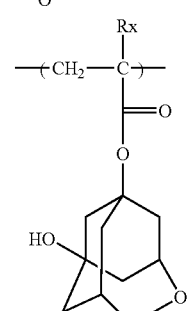
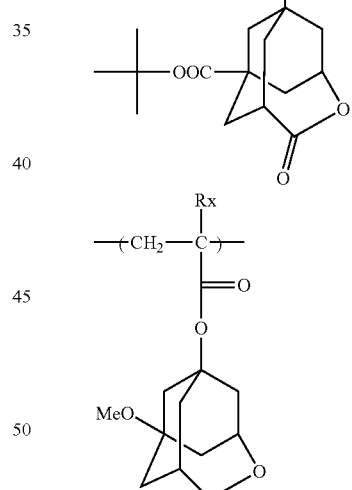

The resin (A2) preferably contains a repeating unit having an alicyclic hydrocarbon structure substituted by a polar group. By virtue of this repeating unit, the adhesion to substrate and the affinity for developer are enhanced. The polar group is preferably a hydroxyl group or a cyano group.

Here, the hydroxyl group as a polar group forms an alcoholic hydroxyl group.

Examples of the polar group-substituted alicyclic hydrocarbon structure include the structures represented by the following formulae (VIIa) and (VIIb).

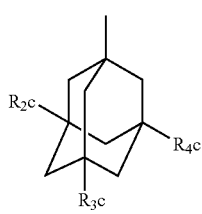
(VIIa)

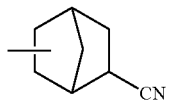
(VIIb)

In formula (VIIa), each of $R_{2c}$ to $R_{4c}$ independently represents a hydrogen atom, a hydroxyl group or a cyano group, provided that at least one of $R_{2c}$ to $R_{4c}$ represents a hydroxyl group or a cyano group. A structure where one or two members out of $R_{2c}$ to $R_{4c}$ are a hydroxyl group with the remaining being a hydrogen atom is preferred, and a structure where two members out of $R_{2c}$ to $R_{4c}$ are a hydroxyl group with the remaining being a hydrogen atom is more preferred.

The group represented by formula (VIIa) is preferably a dihydroxy form or a monohydroxy form, more preferably a dihydroxy form.

The repeating unit having a group represented by formula (VIIa) or (VIIb) includes a repeating unit where at least one of $R_{13}'$ to $R_{16}'$ in formula (II-AB1) or (II-AB2) has a group represented by formula (VIIa) or (VIIb) (for example, $R_5$ of —$COOR_5$ is a group represented by formula (VIIa) or (VIIb)), and repeating units represented by the following formulae (AIIa) and (AIIb):

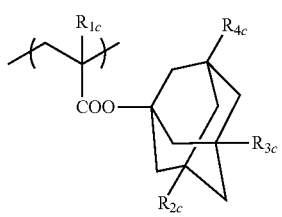
(AIIa)

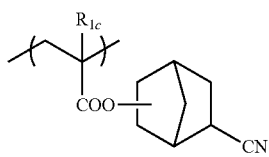
(AIIb)

In formulae (AIIa) and (AIIb), $R_{1c}$ represents a hydrogen atom, a methyl group, a trifluoromethyl group or a hydroxymethyl group.

$R_{2c}$ to $R_{4c}$ have the same meanings as $R_{2c}$ to $R_{4c}$ in formula (VIIa).

Specific examples of the repeating unit having a polar group-substituted alicyclic hydrocarbon structure represented by formula (AIIa) or (AIIb) are set forth below, but the present invention is not limited thereto.

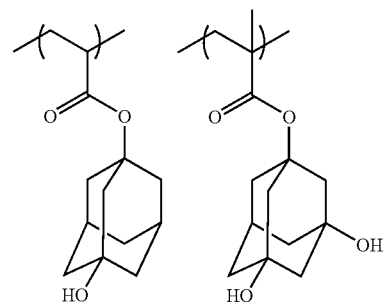

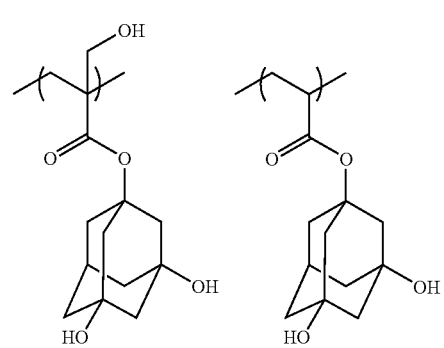

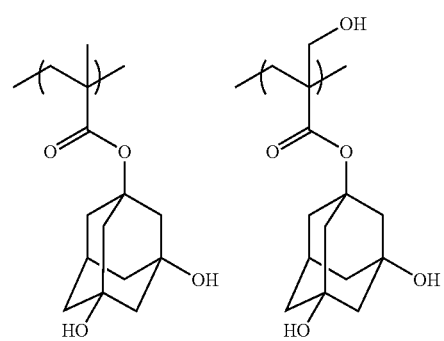

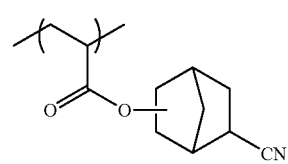

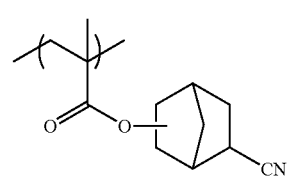

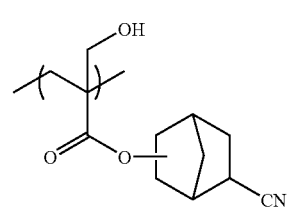

The resin (A2) may contain a repeating unit represented by the following formula (VIII):

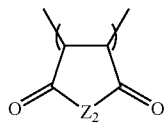
(VIII)

In formula (VIII), $Z_2$ represents —O— or —N($R_{41}$)—. $R_{41}$ represents a hydrogen atom, a hydroxyl group, an alkyl group or —OSO$_2$—$R_{42}$. $R_{42}$ represents an alkyl group, a cycloalkyl group or a camphor residue. The alkyl group of $R_{41}$ and $R_{42}$ may be substituted by a halogen atom (preferably fluorine atom) or the like.

Specific examples of the repeating unit represented by formula (VIII) are set forth below, but the present invention is not limited thereto.

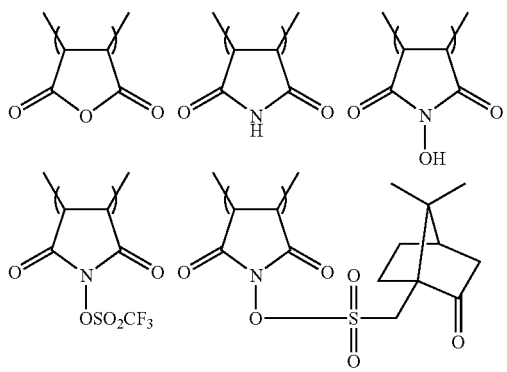

The resin (A2) preferably contains a repeating unit having an alkali-soluble group, more preferably a repeating unit having a carboxyl group. By virtue of containing this repeating unit, the resolution increases in the usage of forming contact holes. As for the repeating unit having a carboxyl group, both a repeating unit where a carboxyl group is directly bonded to the resin main chain, such as repeating unit by an acrylic acid or a methacrylic acid, and a repeating unit where a carboxyl group is bonded to the resin main chain through a linking group are preferred. The linking group may have a monocyclic or polycyclic hydrocarbon structure. An acrylic acid or a methacrylic acid is most preferred.

The resin (A2) may contain a repeating unit having from 1 to 3 groups represented by formula (F1). By virtue of this repeating unit, the performance in terms of line edge roughness is enhanced.

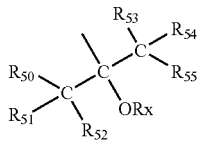
(F1)

In formula (F1), each of $R_{50}$ to $R_{55}$ independently represents a hydrogen atom, a fluorine atom or an alkyl group, provided that at least one of $R_{50}$ to $R_{55}$ is a fluorine atom or an alkyl group with at least one hydrogen atom being substituted by a fluorine atom.

Rx represents a hydrogen atom or an organic group (preferably an acid-decomposable protective group, an alkyl group, a cycloalkyl group, an acyl group or an alkoxycarbonyl group).

The alkyl group of $R_{50}$ to $R_{55}$ may be substituted by a halogen atom (e.g., fluorine), a cyano group or the like, and the alkyl group is preferably an alkyl group having a carbon number of 1 to 3, such as methyl group and trifluoromethyl group.

It is preferred that $R_{50}$ to $R_{55}$ all are a fluorine atom.

The organic group represented by Rx is preferably an acid-decomposable protective group or an alkyl, cycloalkyl, acyl, alkylcarbonyl, alkoxycarbonyl, alkoxycarbonylmethyl, alkoxymethyl or 1-alkoxyethyl group which may have a substituent.

The repeating unit having a group represented by formula (F1) is preferably a repeating unit represented by the following formula (F2):

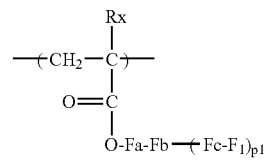
(F2)

In formula (F2), Rx represents a hydrogen atom, a halogen atom or an alkyl group having a carbon number of 1 to 4. Preferred examples of the substituent which the alkyl group of Rx may have include a hydroxyl group and a halogen atom.

Fa represents a single bond or a linear or branched alkylene group and is preferably a single bond.

Fb represents a monocyclic or polycyclic hydrocarbon group.

Fc represents a single bond or a linear or branched alkylene group and is preferably a single bond or a methylene group.

$F_1$ represents a group represented by formula (F1).

$p_1$ represents a number of 1 to 3.

The cyclic hydrocarbon group in Fb is preferably a cyclopentyl group, a cyclohexyl group or a norbornyl group.

Specific examples of the repeating unit having a structure represented by formula (F1) are set forth below.

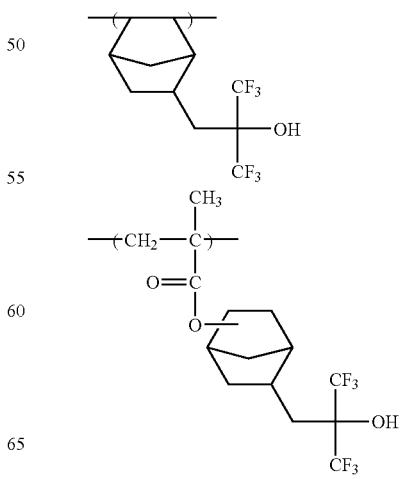

-continued

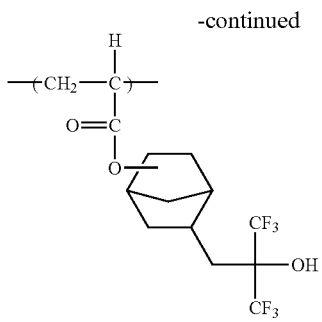

The resin (A2) may contain, in addition to the above-described repeating units, various repeating structural units for the purpose of controlling dry etching resistance, suitability for standard developer, adhesion to substrate, resist profile and properties generally required of the resist, such as resolution, heat resistance and sensitivity.

Examples of such a repeating structural unit include, but are not limited to, repeating structural units corresponding to the monomers described below.

By virtue of such a repeating structural unit, the performance required of the resin (A2), particularly, (1) solubility in coating solvent,
(2) film-forming property (glass transition point),
(3) alkali developability,
(4) film loss (selection of hydrophilic, hydrophobic or alkali-soluble group),
(5) adhesion of unexposed area to substrate,
(6) dry etching resistance
and the like, can be subtly controlled.

Examples of the monomer include a compound having one addition-polymerizable unsaturated bond selected from acrylic acid esters, methacrylic acid esters, acrylamides, methacrylamides, allyl compounds, vinyl ethers and vinyl esters.

Other than these, an addition-polymerizable unsaturated compound copolymerizable with the monomers corresponding to the above-described various repeating structural units may be copolymerized.

In the resin (A2), the molar ratio of respective repeating structural units contained is appropriately determined to control the dry etching resistance of resist, suitability for standard developer, adhesion to substrate, resist profile and performances generally required of the resist, such as resolution, heat resistance and sensitivity.

The preferred embodiment of the resin (A2) includes the followings:

(1) a resin containing a repeating unit having an alicyclic hydrocarbon-containing partial structure represented by formulae (pI) to (pV) (side chain type), preferably a resin containing a (meth)acrylate repeating unit having a structure of formulae (pI) to (pV), and (2) a resin containing a repeating unit represented by formula (II-AB) (main chain type).

The resin of (2) further includes:

(3) a resin having a repeating unit represented by formula (II-AB), a maleic anhydride derivative structure and a (meth) acrylate structure (hybrid type).

In the resin (A2), the content of the repeating unit having an acid-decomposable group is preferably from 10 to 60 mol %, more preferably from 20 to 50 mol %, still more preferably from 25 to 40 mol %, based on all repeating structural units.

In the resin (A2), the content of the repeating unit having an alicyclic hydrocarbon-containing partial structure represented by formulae (pI) to (pV) is preferably from 25 to 70 mol %, more preferably from 35 to 65 mol %, still more preferably from 40 to 60 mol %, based on all repeating structural units.

In the resin (A2), the content of the repeating unit represented by formula (II-AB) is preferably from 10 to 60 mol %, more preferably from 15 to 55 mol %, still more preferably from 20 to 50 mol %, based on all repeating structural units.

In the resin (A2), the content of the repeating unit having a lactone group is preferably from 10 to 70 mol %, more preferably from 20 to 60 mol %, still more preferably from 25 to 60 mol %, based on all repeating structural units.

In the resin (A2), the content of the repeating unit having a polar group-substituted alicyclic hydrocarbon structure is preferably from 1 to 40 mol %, more preferably from 5 to 30 mol %, still more preferably from 5 to 20 mol %, based on all repeating structural units.

The content of the repeating structural unit based on the monomer as the additional copolymerization component, in the resin, can also be appropriately selected according to the desired resist performance but in general, the content thereof is preferably 99 mol % or less, more preferably 90 mol % or less, still more preferably 80 mol % or less, based on the total molar number of the repeating structural unit having an alicyclic hydrocarbon-containing partial structure represented by formulae (pI) to (pV) and the repeating unit represented by formula (II-AB).

The resin (A2) is preferably a resin where all repeating units are composed of a (meth)acrylate repeating unit. In this case, the repeating units may be all a methacrylate, all an acrylate, or a mixture of methacrylate/acrylate, but the content of the acrylate repeating unit is preferably 50 mol % or less based on all repeating units.

The resin is more preferably a ternary copolymerization polymer containing from 25 to 50% of the repeating unit having an alicyclic hydrocarbon-containing partial structure represented by formulae (pI) to (pV), from 25 to 50% of the repeating unit having a lactone structure and from 5 to 30% of the repeating unit having a polar group-substituted alicyclic hydrocarbon structure, or a quaternary copolymerization polymer further containing from 5 to 20 mol % of the repeating unit having a carboxyl group or a structure represented by formula (F1).

The resin (A2) can be synthesized by an ordinary method (for example, radical polymerization). Examples of the synthesis method in general include a batch polymerization method of dissolving the monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and a solvent capable of dissolving the composition of the present invention, which is described later, such as propylene glycol monomethyl ether acetate, propylene glycol monomethyl ether and cyclohexanone. The polymerization is more preferably performed using the same solvent as the solvent used in the photosensitive composition of the present invention. By the use of this solvent, production of particles during storage can be suppressed.

The polymerization reaction is preferably performed in an inert gas atmosphere such as nitrogen and argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobis-dimethylvaleronitrile and dimethyl 2,2'-azobis (2-methylpropionate). The initiator is added additionally or in parts, if desired. After the completion of reaction, the reaction product is charged into a solvent, and the desired polymer is recovered by a method such as powder or solid recovery. The reaction concentration is from 5 to 50 mass %, preferably from 10 to 30 mass %, and the reaction temperature is usually from 10 to 150° C., preferably from 30 to 120° C., more preferably from 50 to 100° C.

The weight average molecular weight (Mw) of the resin (A) is from 1,500 to 3,500, preferably from 2,000 to 3,000, in view of dissolution contrast, prevention of film loss in the unexposed area, dissolution rate of the resin itself in alkali, and the like. The polydispersity (Mw/Mn) is preferably 1.5 or less, more preferably 1.4 or less, still more preferably 1.3 or less.

The weight average molecular weight here is defined as a polystyrene-reduced value determined by gel permeation chromatography.

The polymer for use in the present invention may be polymerized by using any method of radical polymerization, anionic polymerization or cationic polymerization, but from the standpoint of controlling the copolymerization reaction, a radical polymerization method is preferred. Furthermore, from the standpoint of controlling the molecular weight and molecular weight distribution, a living radical polymerization method is more preferred. Specific examples thereof include a method of using a compound selected from a nitroxide compound, an atom-transfer polymerization system and a RAFT agent, and a radical polymerization initiator (azo-based or peroxide-based) in combination. The low molecular resin for use in the present invention can be obtained by controlling the ratio of monomer to polymerization initiator, the polymerization temperature, the polymerization time or the like. The acid-decomposable protective group may be introduced by either a method of copolymerizing a monomer having an acid-decomposable protective group or a method of introducing a protective group into a resin having an alkali-soluble hydroxyl group (e.g., phenolic hydroxyl group) or a carboxyl group.

In the positive photosensitive composition of the present invention, the amount of the resin as the component (A) for use in the present invention, blended in the entire composition, is preferably from 40 to 99.9 mass %, more preferably from 50 to 99 mass %, still more preferably from 80 to 96 mass %, based on the entire solid content.

[2] (B) Compound Capable of Generating a Sulfonic Acid Upon Irradiation with an Actinic Ray or Radiation The resist composition of the present invention contains, as the compound capable of generating an acid upon irradiation with an actinic ray or radiation (acid generator), a compound capable of generating a sulfonic acid upon irradiation with an actinic ray or radiation and preferably further contains a compound capable of generating a carboxylic acid upon irradiation with an actinic ray or radiation.

The acid generator may be appropriately selected from a photo-initiator for cationic photopolymerization, a photo-initiator for radical photopolymerization, a photodecoloring agent for dyes, a photodiscoloring agent, a known compound used for microresist or the like and capable of generating an acid upon irradiation with an actinic ray or radiation, and a mixture thereof.

Examples thereof include a diazonium salt, a phosphonium salt, a sulfonium salt, an iodonium salt, an imidosulfonate, an oxime sulfonate, a diazodisulfone, a disulfone and an o-nitrobenzyl sulfonate.

Also, a compound where such a group or compound capable of generating an acid upon irradiation with an actinic ray or radiation is introduced into the main or side chain of the polymer, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds capable of generating an acid by the effect of light described, for example, in U.S. Pat. No. 3,779,778 and European Patent 126,712 may also be used.

Out of the compounds capable of generating an acid upon irradiation with an actinic ray or radiation, preferred are the compounds represented by the following formulae (ZI), (ZII) and (ZIII):

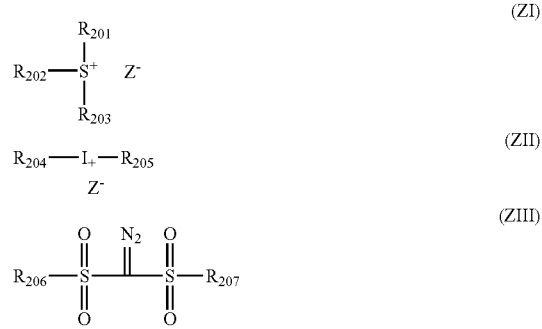

In formula (ZI), each of $R_{201}$, $R_{202}$ and $R_{203}$ independently represents an organic group.

The number of carbons in the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

$Z^-$ represents a non-nucleophilic anion.

Examples of the non-nucleophilic anion as $Z^-$ include a sulfonate anion, a carboxylate anion, a sulfonylimide anion, a bis(alkylsulfonyl)imide anion and a tris(alkylsulfonyl)methyl anion.

The non-nucleophilic anion is an anion having an extremely low ability of causing a nucleophilic reaction and this anion can suppress the decomposition with aging due to intramolecular nucleophilic reaction. By this anion, the aging stability of the resist is enhanced.

Examples of the sulfonate anion include an aliphatic sulfonate anion, an aromatic sulfonate anion and a camphorsulfonate anion.

Examples of the carboxylate anion include an aliphatic carboxylate anion, an aromatic carboxylate anion and an aralkylcarboxylate anion.

The aliphatic moiety in the aliphatic sulfonate anion may be an alkyl group or a cycloalkyl group but is preferably an alkyl group having a carbon number of 1 to 30 or a cycloalkyl group having a carbon number of 3 to 30, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a boronyl group.

The aromatic group in the aromatic sulfonate anion is preferably an aryl group having a carbon number of 6 to 14, and examples thereof include a phenyl group, a tolyl group and a naphthyl group.

The alkyl group, cycloalkyl group and aryl group in the aliphatic sulfonate anion and aromatic sulfonate anion each may have a substituent. Examples of the substituent of the alkyl group, cycloalkyl group and aryl group in the aliphatic sulfonate anion and aromatic sulfonate anion include a nitro group, a halogen atom (e.g., fluorine, chlorine, bromine, iodine), a carboxyl group, a hydroxyl group, an amino group, a cyano group, an alkoxy group (preferably having a carbon number of 1 to 5), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), and an alkoxycarbonyloxy group (preferably having a carbon number of 2 to 7). As for the aryl group or ring structure in each group, examples of the substituent further include an alkyl group (preferably having a carbon number of 1 to 15).

Examples of the aliphatic moiety in the aliphatic carboxylate anion include the same alkyl group and cycloalkyl group as in the aliphatic sulfonate anion.

Examples of the aromatic group in the aromatic carboxylate anion include the same aryl group as in the aromatic sulfonate anion.

The aralkyl group in the aralkylcarboxylate anion is preferably an aralkyl group having a carbon number of 6 to 12, and examples thereof include a benzyl group, a phenethyl group, a naphthylmethyl group, a naphthylethyl group and a naphthylmethyl group.

The alkyl group, cycloalkyl group, aryl group and aralkyl group in the aliphatic carboxylate anion, aromatic carboxylate anion and aralkylcarboxylate anion each may have a substituent. Examples of the substituent of the alkyl group, cycloalkyl group, aryl group and aralkyl group in the aliphatic carboxylate anion, aromatic carboxylate anion and aralkylcarboxylate anion include the same halogen atom, alkyl group, cycloalkyl group, alkoxy group and alkylthio group as in the aromatic sulfonate anion.

Examples of the sulfonylimide anion include saccharin anion.

The alkyl group in the bis(alkylsulfonyl)imide anion and tris(alkylsulfonyl)methyl anion is preferably an alkyl group having a carbon number of 1 to 5, and examples thereof include a methyl group, an ethyl group, a propyl group, an isopropyl group, an n-butyl group, an isobutyl group, a sec-butyl group, a pentyl group and a neopentyl group. Examples of the substituent of such an alkyl group include a halogen atom, a halogen atom-substituted alkyl group, an alkoxy group and an alkylthio group, with a fluorine atom-substituted alkyl group being preferred.

Other examples of the non-nucleophilic anion include fluorinated phosphorus, fluorinated boron and fluorinated antimony.

The non-nucleophilic anion of $Z^-$ is preferably an aliphatic sulfonate anion substituted by a fluorine atom at the α-position of the sulfonic acid, an aromatic sulfonate anion substituted by a fluorine atom or a group having a fluorine atom, a bis(alkylsulfonyl)imide anion with the alkyl group being substituted by a fluorine atom, or a tris(alkylsulfonyl)methide anion with the alkyl group being substituted by a fluorine atom. The non-nucleophilic anion is more preferably a perfluoroaliphatic sulfonate anion having a carbon number of 4 to 8 or a benzenesulfonate anion having a fluorine atom, still more preferably nonafluorobutanesulfonate anion, perfluorooctanesulfonate anion, pentafluorobenzenesulfonate anion or 3,5-bis(trifluoromethyl)benzenesulfonate anion.

Examples of the organic group as $R_{201}$, $R_{202}$ and $R_{203}$ include the corresponding groups in the compounds (ZI-1), (ZI-2) and (ZI-3) described later.

The compound may be a compound having a plurality of structures represented by formula (ZI), for example, may be a compound having a structure where at least one of $R_{201}$ to $R_{203}$ in the compound represented by formula (ZI) is bonded to at least one of $R_{201}$ to $R_{203}$ in another compound represented by formula (ZI).

The component (ZI) is more preferably a compound (ZI-1), (ZI-2) or (ZI-3) described below.

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably a phenyl group or a naphthyl group, more preferably a phenyl group. The aryl group may be an aryl group having a heterocyclic structure containing an oxygen atom, a nitrogen atom, a sulfur atom or the like. Examples of the aryl group having a heterocyclic structure include a pyrrole residue (a group formed by depriving one hydrogen atom from a pyrrole), a furan residue (a group formed by depriving one hydrogen atom from a furan), a thiophene residue (a group formed by depriving one hydrogen atom from a thiophene), an indole residue (a group formed by depriving one hydrogen atom from an indole), a benzofuran residue (a group formed by depriving one hydrogen atom from a benzofuran) and a benzothiophene residue (a group formed by depriving one hydrogen atom from a benzothiophene). In the case where the arylsulfonium compound has two or more aryl groups, these two or more aryl groups may be the same or different.

The alkyl or cycloalkyl group which is present, if desired, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group and a cyclohexyl group.

The aryl group, alkyl group and cycloalkyl group of $R_{201}$ to $R_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4, or an alkoxy group having a carbon number of 1 to 4. The substituent may be substituted to any one of three members $R_{201}$ to $R_{203}$ or may be substituted to all of these three members. In the case where $R_{201}$ to $R_{203}$ are an aryl group, the substituent is preferably substituted at the p-position of the aryl group.

The compound (ZI-2) is described below.

The compound (ZI-2) is a compound where each of $R_{201}$ to $R_{203}$ in formula (ZI) independently represents an aromatic ring-free organic group. The aromatic ring as used herein includes an aromatic ring containing a heteroatom.

The aromatic ring-free organic group as $R_{201}$ to $R_{203}$ has a carbon number of generally from 1 to 30, preferably from 1 to 20.

Each of $R_{201}$ to $R_{203}$ independently represents preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group.

The alkyl group and cycloalkyl group of $R_{201}$ to $R_{203}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl). The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having >C=O at the 2-position of the above-described alkyl group.

The 2-oxocycloalkyl group is preferably a group having >C=O at the 2-position of the above-described cycloalkyl group.

The alkoxy group in the alkoxycarbonylmethyl group is preferably an alkoxy group having a carbon number of 1 to 5 (e.g., methoxy, ethoxy, propoxy, butoxy, pentoxy).

$R_{201}$ to $R_{203}$ each may be further substituted by a halogen atom, an alkoxy group (for example, an alkoxy group having a carbon number of 1 to 5), a hydroxyl group, a cyano group or a nitro group.

The compound (ZI-3) is a compound represented by the following formula (ZI-3), and this is a compound having a phenacylsulfonium salt structure.

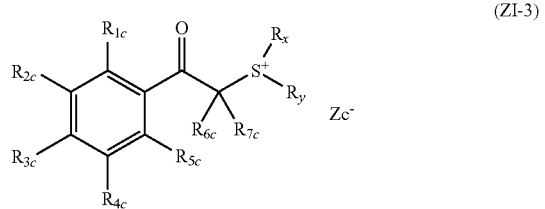

In formula (ZI-3), each of $R_{1c}$ to $R_{5c}$ independently represents a hydrogen atom, an alkyl group, a cycloalkyl group, an alkoxy group or a halogen atom.

Each of $R_{6c}$ and $R_{7c}$ independently represents a hydrogen atom, an alkyl group or a cycloalkyl group.

Each of $R_x$ and $R_y$ independently represents an alkyl group, a cycloalkyl group, an allyl group or a vinyl group.

Any two or more members out of $R_{1c}$ to $R_{5c}$, a pair of $R_{6c}$ and $R_{7c}$, or a pair of $R_x$ and $R_y$ may combine with each other to form a ring structure. This ring structure may contain an oxygen atom, a sulfur atom, an ester bond or an amido bond. Examples of the group formed by combining any two or more members out of $R_{1c}$ to $R_{5c}$, a pair of $R_{6c}$ and $R_{7c}$, or a pair of $R_x$ and $R_y$ include a butylene group and a pentylene group.

$Zc^-$ represents a non-nucleophilic anion, and examples thereof are the same as those of the non-nucleophilic anion of $Z^-$ in formula (ZI).

The alkyl group as $R_{1c}$ to $R_{7c}$ may be either linear or branched and is, for example, an alkyl group having a carbon number of 1 to 20, preferably a linear or branched alkyl group having a carbon number of 1 to 12 (e.g., methyl, ethyl, linear or branched propyl, linear or branched butyl, linear or branched pentyl). The cycloalkyl group is, for example, a cycloalkyl group having a carbon number of 3 to 8 (e.g., cyclopentyl, cyclohexyl).

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (e.g., methoxy, ethoxy, linear or branched propoxy, linear or branched butoxy, linear or branched pentoxy) or a cyclic alkoxy group having a carbon number of 3 to 8 (e.g., cyclopentyloxy, cyclohexyloxy).

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. By virtue of such a compound, the solvent solubility is more enhanced and production of particles during storage can be suppressed.

Examples of the alkyl group and cycloalkyl group as $R_x$ and $R_y$ are the same as those of the alkyl group and cycloalkyl group in $R_{1c}$ to $R_{7c}$. Among these, a 2-oxoalkyl group, a 2-oxocycloalkyl group and an alkoxycarbonylmethyl group are preferred.

Examples of the 2-oxoalkyl group and 2-oxocycloalkyl group include a group having >C=O at the 2-position of the alkyl group or cycloalkyl group as $R_{1c}$ to $R_{7c}$.

Examples of the alkoxy group in the alkoxycarbonylmethyl group are the same as those of the alkoxy group in $R_{1c}$ to $R_{5c}$.

$R_x$ and $R_y$ each is preferably an alkyl or cycloalkyl group having a carbon number of 4 or more, more preferably 6 or more, still more preferably 8 or more.

In formulae (ZII) and (ZIII), each of $R_{204}$ to $R_{207}$ independently represents an aryl group, an alkyl group or a cycloalkyl group.

The aryl group of $R_{204}$ to $R_{207}$ is preferably a phenyl group or a naphthyl group, more preferably a phenyl group. The aryl group of $R_{204}$ to $R_{207}$ may be an aryl group having a heterocyclic structure containing an oxygen atom, a nitrogen atom, a sulfur atom or the like. Examples of the aryl group having a heterocyclic structure include a pyrrole residue (a group formed by depriving one hydrogen atom from a pyrrole), a furan residue (a group formed by depriving one hydrogen atom from a furan), a thiophene residue (a group formed by depriving one hydrogen atom from a thiophene), an indole residue (a group formed by depriving one hydrogen atom from an indole), a benzofuran residue (a group formed by depriving one hydrogen atom from a benzofuran) and a benzothiophene residue (a group formed by depriving one hydrogen atom from a benzothiophene).

The alkyl group and cycloalkyl group in $R_{204}$ to $R_{207}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl).

The aryl group, alkyl group and cycloalkyl group of $R_{204}$ to $R_{207}$ each may have a substituent. Examples of the substituent which the aryl group, alkyl group and cycloalkyl group of $R_{204}$ to $R_{207}$ each may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

$Z^-$ represents a non-nucleophilic anion, and examples thereof are the same as those of the non-nucleophilic anion of $Z^-$ in formula (ZI).

Other examples of the compound capable of generating an acid upon irradiation with an actinic ray or radiation, which can be used, include the compounds represented by the following formulae (ZIV), (ZV) and (ZVI).

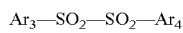

$$Ar_3-SO_2-SO_2-Ar_4 \quad (ZIV)$$

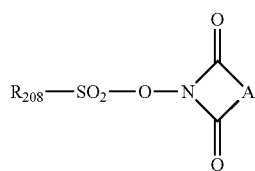

(ZV)

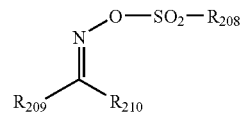

(ZVI)

In formulae (ZIV) to (ZVI), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Among the compounds capable of generating an acid upon irradiation with an actinic ray or radiation, more preferred are the compounds represented by formulae (ZI) to (ZIII).

Also, the compound capable of generating an acid upon irradiation with an actinic ray or radiation is preferably a compound capable of generating an acid having one sulfonic acid group or imide group, more preferably a compound capable of generating a monovalent perfluoroalkanesulfonic acid, a compound capable of generating a monovalent aromatic sulfonic acid substituted by a fluorine atom or a fluorine atom-containing group, or a compound capable of generating a monovalent imide acid substituted by a fluorine atom or a fluorine atom-containing group, still more preferably a sulfonium salt of fluoro-substituted alkanesulfonic acid, fluorine-substituted benzenesulfonic acid or fluorine-substituted imide acid. As for the acid generator which can be used, the acid generated is preferably a fluoro-substituted alkanesulfonic acid, fluoro-substituted benzenesulfonic acid or fluoro-substituted imide acid, with the pKa being pKa=−1 or less, and in this case, the sensitivity can be enhanced.

Out of the compounds capable of generating an acid upon irradiation with an actinic ray or radiation, particularly preferred compounds are set forth below.

(z1)
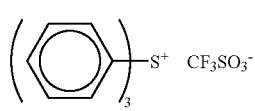

(z2)
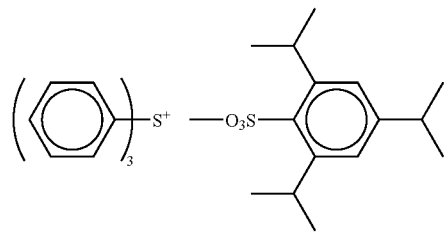

(z3)
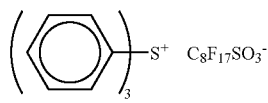

(z4)

(z5)
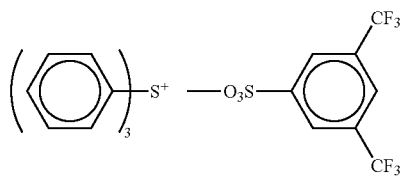

(z6)
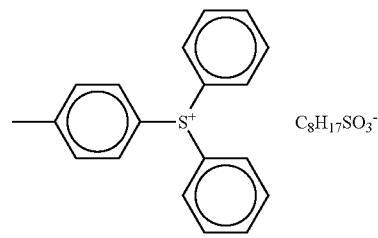

(z7)
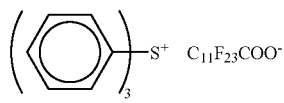

(z8)
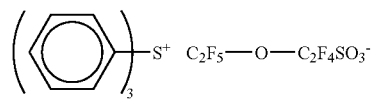

-continued
(z9) 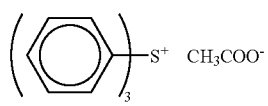
(z10) 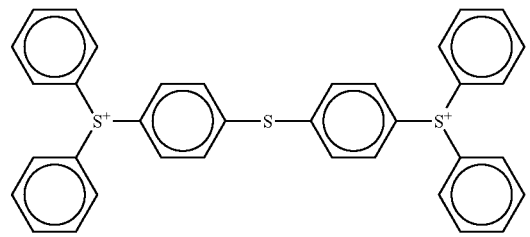 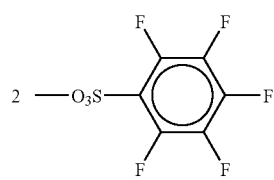
(z11) 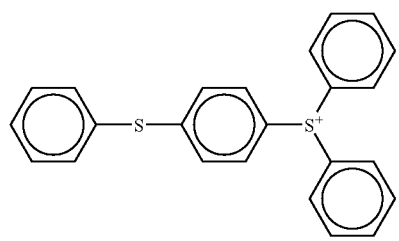
(z12) 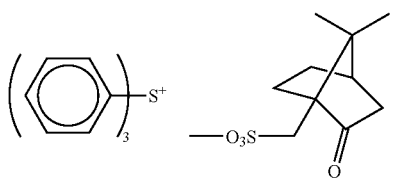
(z13) 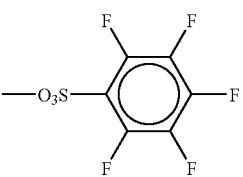
(z14) 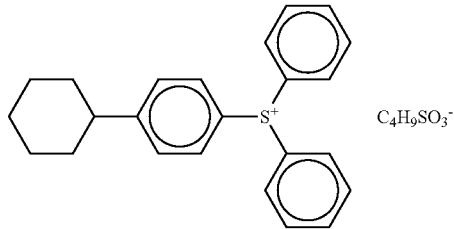
(z15) 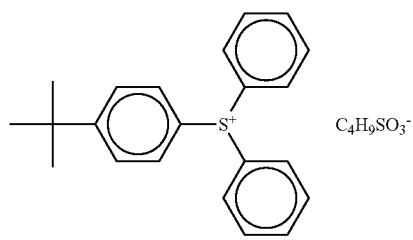
(z16) 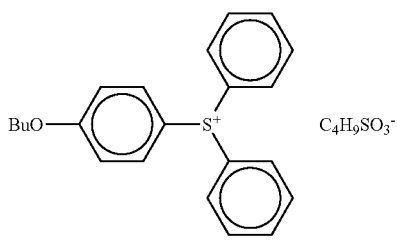
(z17) 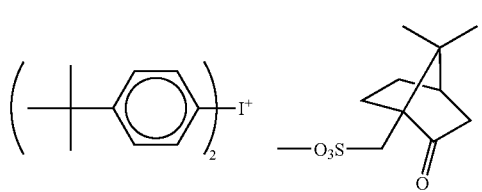
(z18) 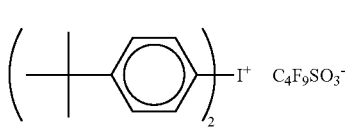

-continued
(z19)
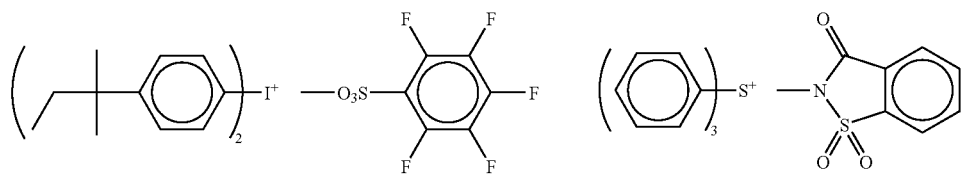
(z20)
(z21)
(z22)
(z23)
(z24)
(z25)
(z26)
(z27)
(z28)
(z29)
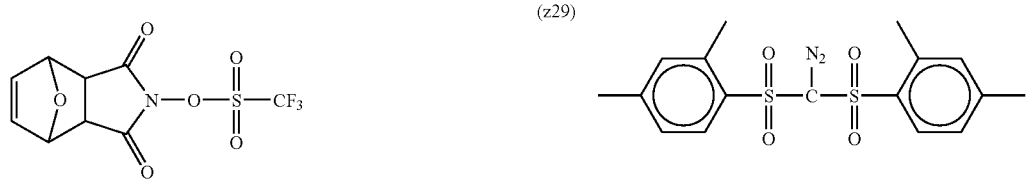
(z30)
(z31)
(z32)
(z33)
(z34)
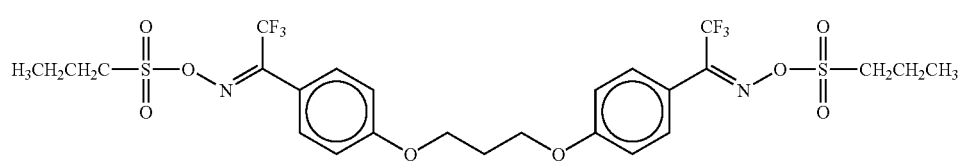

-continued
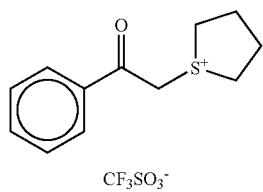
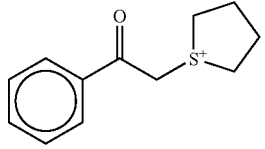
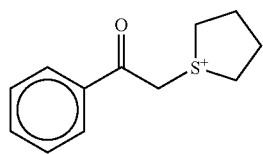
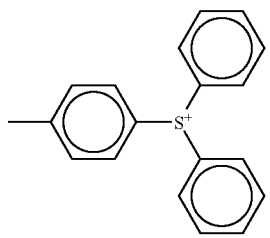
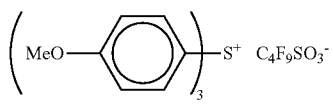
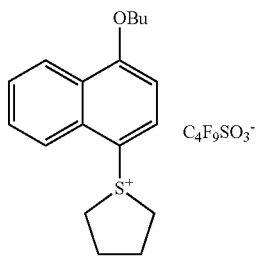
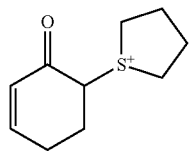
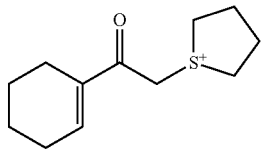
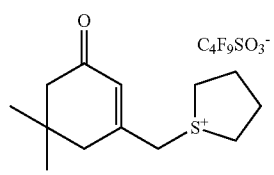
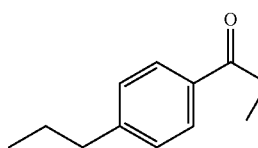
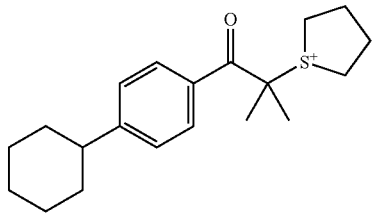
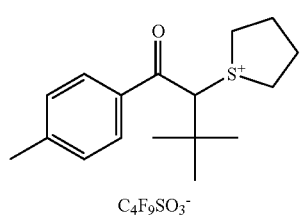
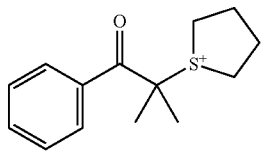
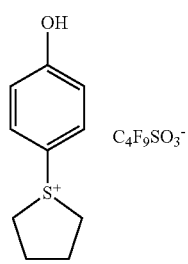
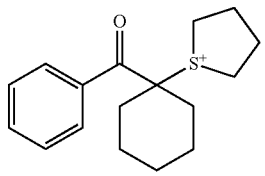

-continued
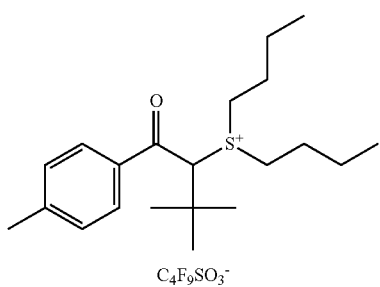 (z49)
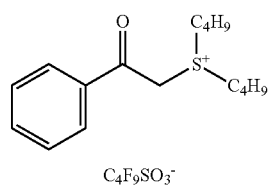 (z50)
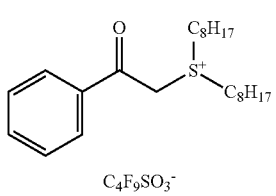 (z51)
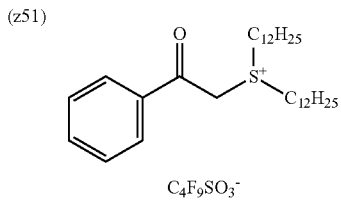 (z52)
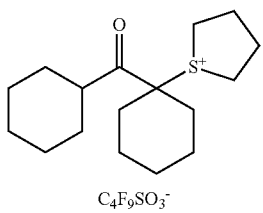 (z53)
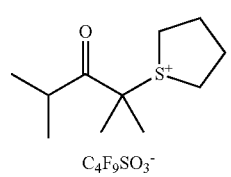 (z54)
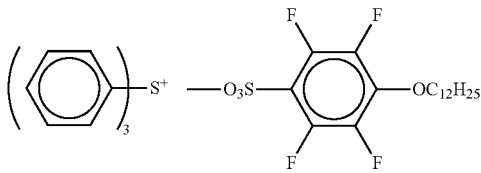 (z55)
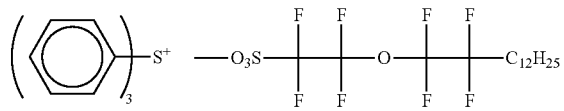 (z56)
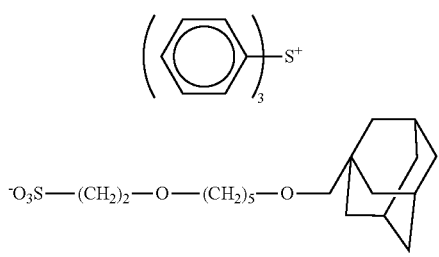 (z57)
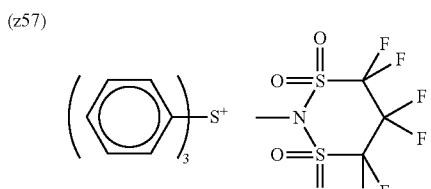 (z58)
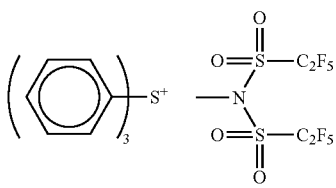 (z59)
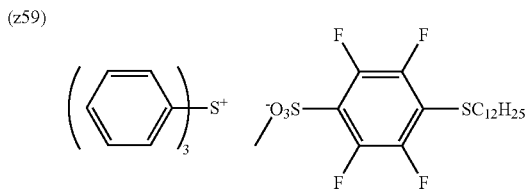 (z60)
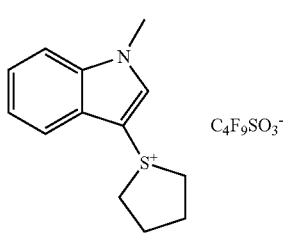 (z61)
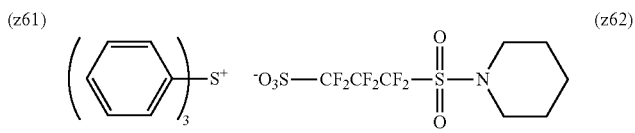 (z62)

-continued

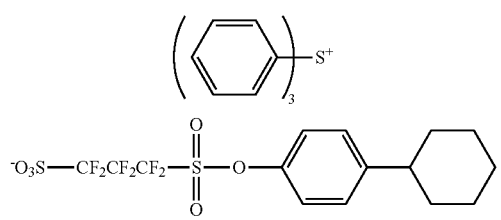
(z63)

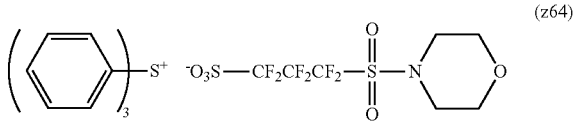
(z64)

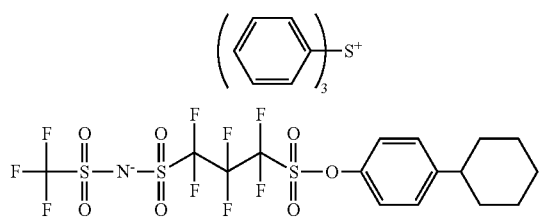
(z65)

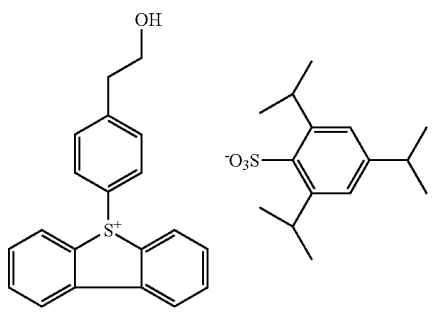
(z66)

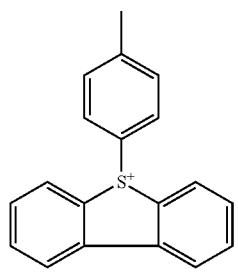
(z67)

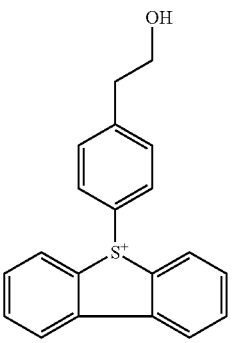
(z68)

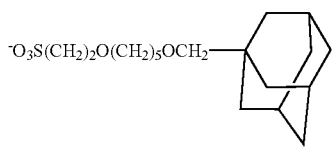

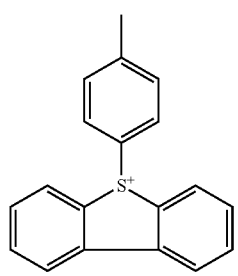
(z69)

One of these acid generators may be used alone, or two or more thereof may be used in combination. In the case of using two or more in combination, compounds capable of generating two kinds of organic acids differing in the total atom number except for hydrogen atom by 2 or more are preferably combined.

The content of the acid generator in the composition is preferably from 0.1 to 20 mass %, more preferably from 0.5 to 10 mass %, still more preferably from 1 to 7 mass %, based on the entire solid content of the resist composition.

Dissolution-inhibiting compound capable of decomposing by the action of an acid to increase the solubility in an alkali developer and having a molecular weight of 3,000 or less (hereinafter sometimes referred to as a "component (D)" or a "dissolution-inhibiting compound"):

In order to prevent reduction in the transparency to light at 220 nm or less, the (D) dissolution-inhibiting compound capable of decomposing by the action of an acid to increase the solubility in an alkali developer and having a molecular weight of 3,000 or less is preferably an alicyclic or aliphatic compound containing an acid-decomposable group, such as acid-decomposable group-containing cholic acid derivative described in *Proceeding of SPIE*, 2724, 355 (1996).

Examples of the acid-decomposable group and alicyclic structure are the same as those described above for the alicyclic hydrocarbon-based acid-decomposable resin.

In the case of irradiating the photosensitive composition of the present invention with an electron beam, the composition preferably contains a structure where the phenolic hydroxyl group of a phenol compound is substituted by an acid-decomposable group. The phenol compound is preferably a compound containing from 1 to 9 phenol skeletons, more preferably from 2 to 6 phenol skeletons.

The molecular weight of the dissolution-inhibiting compound for use in the present invention is generally 3,000 or less, preferably from 300 to 3,000, more preferably from 500 to 2,500.

The amount of the dissolution-inhibiting compound added is preferably from 3 to 50 mass %, more preferably from 5 to 40 mass %, based on the solid content of the photosensitive composition.

Specific examples of the dissolution-inhibiting compound are set forth below, but the present invention is not limited thereto.

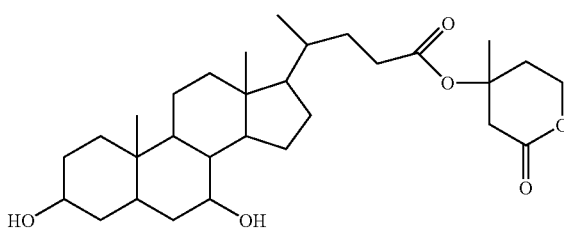

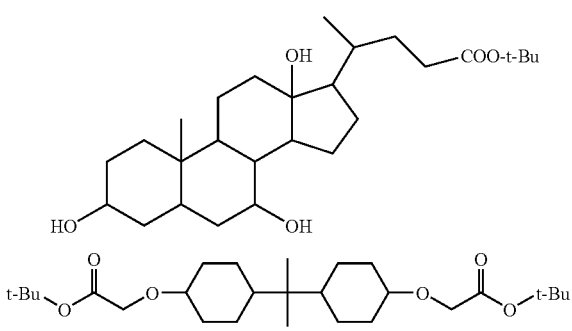

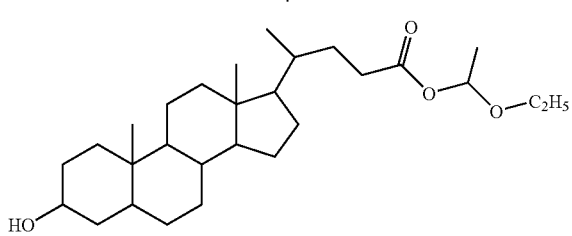

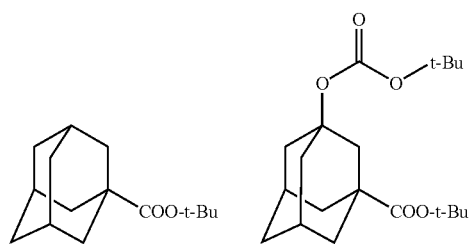

-continued

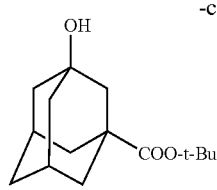

Basic Compound:

The photosensitive composition of the present invention preferably contains a basic compound for reducing the change in performance with aging from exposure until heating.

As for the preferred structure, the basic compound includes a compound having a structure represented by the following formulae (A) to (E).

(A)

(B)

(C)

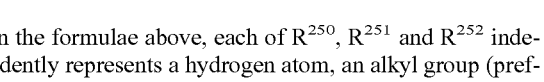

(D)

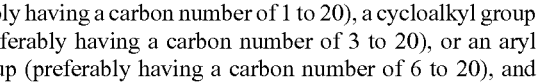

(E)

In the formulae above, each of $R^{250}$, $R^{251}$ and $R^{252}$ independently represents a hydrogen atom, an alkyl group (preferably having a carbon number of 1 to 20), a cycloalkyl group (preferably having a carbon number of 3 to 20), or an aryl group (preferably having a carbon number of 6 to 20), and $R^{250}$ and $R^{251}$ may combine with each other to form a ring.

These groups each may have a substituent. The alkyl or cycloalkyl group having a substituent is preferably an aminoalkyl group having a carbon number of 1 to 20, an aminocycloalkyl group having a carbon number of 3 to 20, a hydroxyalkyl group having a carbon number of 1 to 20, or a hydroxycycloalkyl group having a carbon number of 3 to 20.

The alkyl chain thereof may contain an oxygen atom, a sulfur atom or a nitrogen atom.

In the formulae, each of $R^{253}$, $R^{254}$, $R^{255}$ and $R^{256}$ independently represents an alkyl group (preferably having a carbon number of 1 to 6) or a cycloalkyl group (preferably having a carbon number of 3 to 6).

Preferred examples of the compound include guanidine, aminopyrrolidine, pyrazole, pyrazoline, piperazine, aminomorpholine, aminoalkylmorpholine and piperidine, and these compounds each may have a substituent. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole and benzimidazole. Examples of the compound having a diazabicyclo structure include 1,4-diazabicyclo[2,2,2]octane, 1,5-diazabicyclo-[4,3,0]non-5-ene and 1,8-diazabicyclo[5,4,0]undec-7-ene. Examples of the compound having an onium hydroxide structure include a triarylsulfonium hydroxide, a phenacylsulfonium hydroxide and a sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. The compound having an onium carboxylate structure is a compound where the anion moiety of the compound having an onium hydroxide structure is changed to a carboxylate, and examples thereof include acetate, adamantane-1-carboxylate and perfluoroalkyl carboxylate. Examples of the compound having a trialkylamine structure include tri(n-butyl)amine and tri(n-octyl)amine. Examples of the aniline compound include 2,6-diisopropylaniline and N,N-dimethylaniline. Examples of the alkylamine derivative having a hydroxyl group and/or an ether bond include ethanolamine, diethanolamine, triethanolamine, and tris(methoxyethoxyethyl) amine. Examples of the aniline derivative having a hydroxyl group and/or an ether bond include N,N-bis(hydroxyethyl) aniline.

Other examples include at least one nitrogen-containing compound selected from a phenoxy group-containing amine compound, a phenoxy group-containing ammonium salt compound, a sulfonic acid ester group-containing amine compound and a sulfonic acid ester group-containing ammonium salt compound.

As for the amine compound, a primary, secondary or tertiary amine compound can be used, and an amine compound where at least one alkyl group is bonded to the nitrogen atom is preferred. The amine compound is more preferably a tertiary amine compound. In the amine compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom in addition to the alkyl group.

The amine compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group ($-CH_2CH_2O-$) and an oxypropylene group ($-CH(CH_3)CH_2O-$ or $-CH_2CH_2CH_2O-$) are preferred, and an oxyethylene group is more preferred.

As for the ammonium salt compound, a primary, secondary, tertiary or quaternary ammonium salt compound can be used, and an ammonium salt compound where at least one alkyl group is bonded to the nitrogen atom is preferred. In the ammonium salt compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom in addition to the alkyl group.

The ammonium salt compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group ($-CH_2CH_2O-$) and an oxypropylene group ($-CH(CH_3)CH_2O-$ or $-CH_2CH_2CH_2O-$) are preferred, and an oxyethylene group is more preferred. Examples of the anion of the ammonium salt compound include a halogen atom, a sulfonate, a borate and a phosphate, with a halogen atom and a sulfonate being preferred. The halogen atom is preferably chloride, bromide or iodide, and the sulfonate is preferably an organic sulfonate having a carbon number of 1 to 20. Examples of the organic sulfonate include an alkylsulfonate having a carbon number of 1 to 20 and an arylsulfonate. The alkyl group of the alkylsulfonate may have a substituent, and examples of the substituent include fluorine, chlorine, bromine, an alkoxy group, an acyl group and an aryl group. Specific examples of the alkylsulfonate include methanesulfonate, ethanesulfonate, butanesulfonate, hexanesulfonate, octanesulfonate, benzylsulfonate, trifluoromethanesulfonate, pentafluoroethanesulfonate and nonafluorobutanesulfonate. The aryl group of the arylsulfonate includes a benzene ring, a naphthalene ring and an anthracene ring. The benzene ring, naphthalene ring and anthracene ring each may have a substituent, and the substituent is preferably a linear or branched alkyl group having a carbon number of 1 to 6, or a cycloalkyl group having a carbon number of 3 to 6. Specific examples of the linear or branched alkyl group and the cycloalkyl group include methyl, ethyl, n-propyl, isopropyl, n-butyl, i-butyl, tert-butyl, n-hexyl and cyclohexyl. Other examples of the substituent include an alkoxy group having a carbon number of 1 to 6, a halogen atom, cyano, nitro, an acyl group and an acyloxy group.

The amine compound having a phenoxy group and the ammonium salt compound having a phenoxy group are a compound where the alkyl group of an amine compound or ammonium salt compound has a phenoxy group at the terminal opposite the nitrogen atom. The phenoxy group may have a substituent. Examples of the substituent of the phenoxy group include an alkyl group, an alkoxy group, a halogen atom, a cyano group, a nitro group, a carboxyl group, a carboxylic acid ester group, a sulfonic acid ester group, an aryl group, an aralkyl group, an acyloxy group and an aryloxy group. The substitution site of the substituent may be any of 2- to 6-positions, and the number of substituents may be any in the range from 1 to 5.

The compound preferably has at least one oxyalkylene group between the phenoxy group and the nitrogen atom. The number of oxyalkylene groups within the molecule is 1 or more, preferably from 3 to 9, more preferably from 4 to 6. Among oxyalkylene groups, an oxyethylene group ($-CH_2CH_2O-$) and an oxypropylene group ($-CH(CH_3)CH_2O-$ or $-CH_2CH_2CH_2O-$) are preferred, and an oxyethylene group is more preferred.

The sulfonic acid ester group in the amine compound having a sulfonic acid ester group and the ammonium salt compound having a sulfonic acid ester group may be any of an alkylsulfonic acid ester, a cycloalkylsulfonic acid ester and an arylsulfonic acid ester. In the case of an alkylsulfonic acid ester, the alkyl group preferably has a carbon number of 1 to 20, in the case of a cycloalkylsulfonic acid ester, the cycloalkyl group preferably has a carbon number of 3 to 20, and in the case of an arylsulfonic acid ester, the aryl group preferably has a carbon number of 6 to 12. The alkylsulfonic acid ester, cycloalkylsulfonic acid ester and arylsulfonic acid ester may have a substituent, and the substituent is preferably a halogen atom, a cyano group, a nitro group, a carboxyl group, a carboxylic acid ester group or a sulfonic acid ester group.

The compound preferably has at least one oxyalkylene group between the sulfonic acid ester group and the nitrogen atom. The number of oxyalkylene groups within the molecule is 1 or more, preferably from 3 to 9, more preferably from 4 to 6. Among oxyalkylene groups, an oxyethylene group (—$CH_2CH_2O$—) and an oxypropylene group (—$CH(CH_3)CH_2O$— or —$CH_2CH_2CH_2$—) are preferred, and an oxyethylene group is more preferred.

The amine compound having a phenoxy group can be obtained by reacting a primary or secondary amine having a phenoxy group with a haloalkyl ether under heating, adding an aqueous solution of strong base such as sodium hydroxide, potassium hydroxide and tetraalkylammonium, and performing extraction with an organic solvent such as ethyl acetate and chloroform, or by reacting a primary or secondary amine with a haloalkyl ether having a phenoxy group at the terminal under heating, adding an aqueous solution of strong base such as sodium hydroxide, potassium hydroxide and tetraalkylammonium, and performing extraction with an organic solvent such as ethyl acetate and chloroform.

One of these basic compounds may be used alone, or two or more thereof may be used in combination. However, when the amount of the component (B) used is 0.05 mass % or more, a basic substance may or may not be used. In the case of using a basic compound, the amount thereof is usually from 0.001 to 10 mass %, preferably from 0.01 to 5 mass %, based on the solid content of the photosensitive composition. The amount used is preferably 0.001 mass % or more for obtaining a sufficiently high addition effect and preferably 10 mass % or less in view of sensitivity and developability of the unexposed area.

Fluorine-Containing and/or Silicon-Containing Surfactants:

The photosensitive composition of the present invention preferably further contains any one of fluorine-containing and/or silicon-containing surfactants (a fluorine-containing surfactant, a silicon-containing surfactant, and a surfactant containing both a fluorine atom and a silicon atom), or two or more thereof.

By incorporating the fluorine-containing and/or silicon-containing surfactant into the photosensitive composition of the present invention, a resist pattern with good sensitivity, resolution and adherence as well as less development defect can be obtained when using an exposure light source of 250 nm or less, particularly 220 nm or less.

Examples of the fluorine-containing and/or silicon-containing surfactants include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing surfactant and a silicon-containing surfactant, such as EFtop EF301 and EF303 (produced by Shin-Akita Kasei K. K.); Florad FC430 and 431 (produced by Sumitomo 3M Inc.); Megaface F171, F173, F176, F189 and R08 (produced by Dainippon Ink & Chemicals, Inc.); Surflon S-382, SC101, 102, 103, 104, 105 and 106 (produced by Asahi Glass Co., Ltd.); and Troysol S-366 (produced by Troy Chemical). In addition, polysiloxane polymer KP-341 (produced by Shin-Etsu Chemical Co., Ltd.) may also be used as a silicon-containing surfactant.

Other than these known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

The polymer having a fluoro-aliphatic group is preferably a copolymer of a fluoro-aliphatic group-containing monomer with a (poly(oxyalkylene)) acrylate and/or a (poly(oxyalkylene))methacrylate, and the polymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoro-aliphatic group-containing monomer and a (poly(oxyalkylene))acrylate (or methacrylate) is not limited only to a binary copolymer but may also be a ternary or greater copolymer obtained by simultaneously copolymerizing two or more different fluoro-aliphatic group-containing monomers or two or more different (poly(oxyalkylene))acrylates (or methacrylates).

Examples thereof include, as the commercially available surfactant, Megaface F178, F-470, F-473, F-475, F-476 and F-472 (produced by Dainippon Ink & Chemicals, Inc.) and further include a copolymer of a $C_6F_{13}$ group-containing acrylate (or methacrylate) with a (poly(oxyalkylene))acrylate (or methacrylate), a copolymer of a $C_6F_{13}$ group-containing acrylate (or methacrylate) with a (poly(oxyethylene))acrylate (or methacrylate) and a (poly(oxypropylene))acrylate (or methacrylate), a copolymer of a $C_8F_{17}$ group-containing acrylate (or methacrylate) with a (poly(oxyalkylene))acrylate (or methacrylate), and a copolymer of a $C_8F_{17}$ group-containing acrylate (or methacrylate) with a (poly(oxyethylene))acrylate (or methacrylate) and a (poly(oxypropylene))acrylate (or methacrylate).

The amount of the fluorine-containing and/or silicon-containing surfactants used is preferably from 0.0001 to 2 mass %, more preferably from 0.001 to 1 mass %, based on the entire amount of the photosensitive composition (excluding the solvent).

Solvent:

The resist composition of the present invention is dissolved in a solvent capable of dissolving respective components described above and then coated on a support. The resist composition is stored, for example, in a refrigerated state or at room temperature and needs to cause no change in performance during the storage period but is burdened with a problem that the sensitivity fluctuates. In this respect, it is found that the fluctuation of sensitivity can be remarkably suppressed by adjusting the solid content concentration to be from 2.5 to 4.5%. This is an utterly unforeseen effect. The solid content concentration is preferably from 3.0 to 4.0%.

Examples of the organic solvent which can be used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran.

In the present invention, propylene glycol monomethyl ether or propylene glycol monomethyl ether acetate is preferably used. In particular, it is preferred to use propylene glycol monomethyl ether and propylene glycol monomethyl ether acetate in combination. In using these solvents in combination, the ratio (by mass) is preferably from 10/90 to 95/5, more preferably from 20/80 to 80/20.

(Ia) Ketone-Based Solvent

As for the solvent used in the present invention, a solvent having at least one ketone structure is also preferred.

The solvent having a ketone structure include a chain ketone solvent and a cyclic ketone solvent, and a compound having a total carbon umber of 5 to 8 is preferred because of good coatability.

Examples of the chain ketone solvent include 2-heptanone, methyl ethyl ketone and methyl isobutyl ketone, with 2-heptanone being preferred.

Examples of the cyclic ketone solvent include cyclopentanone, 3-methyl-2-cyclopentanone, cyclohexanone, 2-methylcyclohexanone, 2,6-dimethylcyclohexanone, cycloheptanone, cyclooctanone and isophorone, with cyclohexanone and cycloheptanone being preferred.

The solvent may be the ketone structure-containing solvent alone or may be a mixed solvent with other solvents. Examples of the solvent mixed (solvent used in combination) include a propylene glycol monoalkyl ether carboxylate, an alkyl lactate, a propylene glycol monoalkyl ether, an alkyl alkoxypropionate and a lactone compound.

Examples of the propylene glycol monoalkyl ether carboxylate include propylene glycol monomethyl ether acetate, propylene glycol monomethyl ether propionate and propylene glycol monoethyl ether acetate.

Examples of the alkyl lactate include methyl lactate and ethyl lactate.

Examples of the propylene glycol monoalkyl ether include propylene glycol monomethyl ether and propylene glycol monoethyl ether.

Examples of the alkyl alkoxypropionate include methyl methoxypropionate, ethyl methoxypropionate, methyl ethoxypropionate and ethyl ethoxypropionate.

Examples of the lactone compound include γ-butyrolactone.

The solvent used in combination is preferably a propylene glycol monoalkyl ether carboxylate, an alkyl lactate or a propylene glycol monoalkyl ether, more preferably propylene glycol monomethyl ether acetate.

By mixing the ketone-based solvent and the solvent used in combination, the adhesion to substrate, the developability, DOF and the like are improved.

The ratio (by mass) of the ketone-based solvent to the solvent used in combination is preferably from 10/90 to 95/5, more preferably from 20/80 to 80/20, still more preferably from 30/70 to 70/30.

Also, from the standpoint of enhancing the film thickness uniformity or the performance in terms of development defect, a high boiling point solvent having a boiling point of 200° C. or more, such as ethylene carbonate and propylene carbonate, may be mixed.

The amount of the high boiling point solvent added is usually from 0.1 to 15 mass %, preferably from 0.5 to 10 mass %, more preferably from 1 to 5 mass %, based on the entire solvent.

From the standpoint of enhancing the resolution, the photosensitive composition of the present invention is preferably used in a film thickness of 30 to 250 nm, more preferably from 30 to 100 nm. Such a film thickness can be obtained by setting the solid content concentration in the photosensitive composition to an appropriate range and thereby giving an appropriate viscosity to enhance the coatability and film-forming property.

Other Additives:

The photosensitive composition of the present invention may further contain, for example, a dye, a plasticizer, a photosensitizer, a surfactant other than those described above, a photosensitizer, and a compound capable of accelerating solubility in a developer, if desired.

The compound capable of accelerating the dissolution in a developer, which can be used in the present invention, is a low molecular compound containing two or more phenolic OH groups or one or more carboxy groups and having a molecular weight of 1,000 or less. In the case of containing a carboxyl group, an alicyclic or aliphatic compound is preferred.

The amount of the dissolution accelerating compound added is preferably from 2 to 50 mass %, more preferably from 5 to 30 mass %, based on the resin as the component (A). The amount added is preferably 50 mass % or less from the standpoint of suppressing the development scum or preventing the deformation of pattern at the development.

The phenol compound having a molecular weight of 1,000 or less can be easily synthesized by one skilled in the art with reference to the method described, for example, in JP-A-4-122938, JP-A-2-28531, U.S. Pat. No. 4,916,210 and European Patent 219294.

Specific examples of the alicyclic or aliphatic compound having a carboxy group include, but are not limited to, a carboxylic acid derivative having a steroid structure, such as cholic acid, deoxycholic acid and lithocholic acid, an adamantane carboxylic acid derivative, an adamantane dicarboxylic acid, a cyclohexanecarboxylic acid and a cyclohexanedicarboxylic acid.

In the present invention, a surfactant other than the fluorine-containing and/or silicon-containing surfactants above may also be added. Specific examples thereof include a nonionic surfactant such as polyoxyethylene alkyl ethers, polyoxyethylene alkylallyl ethers, polyoxyethylene●polyoxypropylene block copolymers, sorbitan aliphatic esters, and polyoxyethylene sorbitan aliphatic esters.

One of these surfactants may be added alone, or several members thereof may be added in combination.

Pattern Forming Method:

The photosensitive composition of the present invention is used by dissolving the above-described components in a predetermined organic solvent, preferably in the mixed solvent above, and coating the solution on a predetermined support as follows.

For example, the photosensitive composition is coated on such a substrate (e.g., silicon/silicon dioxide-coated substrate) as used in the production of a precision integrated circuit device, by an appropriate coating method such as spinner or coater, and dried to form a photosensitive film. Incidentally, a known antireflection film may also be previously provided.

The photosensitive film formed is irradiated with an actinic ray or radiation through a predetermined mask, then preferably baked (heated), and developed, whereby a good pattern can be obtained.

At the irradiation with an actinic ray or radiation, the exposure may be performed by filling a liquid having a refractive index higher than that of air between the photosensitive film and the lens (immersion exposure). By this exposure, the resolution can be enhanced.

In the present invention, a commercially available inorganic or organic antireflection film may be used, if desired. Furthermore, the antireflection film may also be used by coating it as an underlying layer of the resist.

The antireflection film used as an underlying layer of the resist may be either an inorganic film such as titanium, titanium dioxide, titanium nitride, chromium oxide, carbon and amorphous silicon, or an organic film comprising a light absorbent and a polymer material. The former requires equipment for the film formation, such as vacuum deposition apparatus, CVD apparatus and sputtering apparatus. Examples of the organic antireflection film include a film comprising a diphenylamine derivative and formaldehyde-modified melamine resin condensate, an alkali-soluble resin and a light absorbent described in JP-B-7-69611 (the term "JP-B" as used herein means an "examined Japanese patent publication"), a reaction product of a maleic anhydride copolymer and a diamine-type light absorbent described in U.S. Pat. No. 5,294,680, a film containing a resin binder and a methylolmelamine-based heat crosslinking agent described in JP-A-6-118631, an acrylic resin-type antireflection film containing a carboxylic acid group, an epoxy group and a light absorbing group within the same molecule described in JP-A-6-118656, a film comprising methylolmelamine and a benzophenone-based light absorbent described in JP-A-8-87115, and a film obtained by adding a low molecular light absorbent to a polyvinyl alcohol resin described in JP-A-8-179509.

Also, the organic antireflection film may be a commercially available organic antireflection film such as DUV30 Series and DUV-40 Series (produced by Brewer Science, Inc.), and AR-2, AR-3 and AR-5 (produced by Shipley Co., Ltd.).

In the production or the like of a precision integrated circuit device, the process of forming a pattern on a resist film is performed by coating the positive resist composition of the present invention on a substrate (for example, a silicon/silicon dioxide-coated substrate, a glass substrate, an ITO substrate or a quartz/chromium oxide-coated substrate) to form a resist film, irradiating an actinic ray or radiation such as X-ray, electron beam and EUV light, and then subjecting the resist film to heating, development, rinsing and drying, whereby a good pattern can be formed.

The resist composition is preferably coated by spin coating. The rotation number at the spin coating can be appropriately selected but is preferably from 800 to 2,500 rpm, more preferably from 1,000 to 2,000 rpm, still more preferably from 1,200 to 1,600 rpm.

The alkali developer which can be used in the development is an aqueous solution of an alkali (usually, from 0.1 to 20 mass %) such as inorganic alkalis (e.g., sodium hydroxide, potassium hydroxide, sodium carbonate, sodium silicate, sodium metasilicate, aqueous ammonia), primary amines (e.g., ethylamine, n-propylamine), secondary amines (e.g., diethylamine, di-n-butylamine), tertiary amines (e.g., triethylamine, methyldiethylamine), alcohol amines (e.g., dimethylethanolamine, triethanolamine), quaternary ammonium salts (e.g., tetramethylammonium hydroxide, tetraethylammonium hydroxide, choline) and cyclic amines (e.g., pyrrole, piperidine). In this aqueous solution of an alkali, alcohols such as isopropyl alcohol and a surfactant such as nonionic surfactant may be added each in an appropriate amount.

Among these developers, a quaternary ammonium salt is preferred, and tetramethylammonium hydroxide and choline are more preferred.

The alkali concentration of the alkali developer is usually from 0.1 to 20 mass %. The pH of the alkali developer is usually from 10 to 15.

EXAMPLE 1

The present invention is described in greater detail below by referring to Examples, but the present invention should not be construed as being limited thereto.

SYNTHESIS EXAMPLE 1

Synthesis of Resin RB-19 p-Acetoxystyrene and (4'-hydroxyphenyl)methacrylate are charged at a ratio of 60/40 (mole fraction) and dissolved in tetrahydrofuran to prepare 100 mL of a solution having a solid content concentration of 20 mass %. To this solution, 3 mol % of methyl mercaptopropionate and 4 mol % of a polymerization initiator, V-65, produced by Wako Pure Chemical Industries, Ltd. are added, and the resulting solution is added dropwise to 10 mL of tetrahydrofuran heated to 60° C., over 4 hours in a nitrogen atmosphere. After the completion of dropwise addition, the reaction solution is heated for 4 hours, and 1 mol % of V-65 is again added, followed by stirring for 4 hours. When the reaction is completed, the reaction solution is cooled to room temperature and after crystallization in 3 L of hexane, the precipitated white powder is collected by filtration.

The compositional ratio of the polymer determined from $C^{13}$NMR is 58/42. Also, the weight average molecular weight determined by GPC is 2,200 in terms of standard polystyrene, and the polydispersity (Mw/Mn) is 1.30.

The resin obtained is vacuum-dried and then dissolved in 100 ml of dehydrated THF (tetrahydrofuran), and 10 ml of cyclohexyl vinyl ether is added thereto. While stirring the resulting solution, 100 mg of p-toluenesulfonic acid is added, and the reaction is allowed to proceed for 3 hours. The reaction solution is neutralized by adding 1 ml of triethylamine, and then, liquid separation and washing are repeated three times by adding 200 ml of ethyl acetate and further adding 500 ml of distilled water. The ethyl acetate layer is reprecipitated from hexane to obtain the objective resin RB-19 (compositional molar ratio: 43/15/32/10, weight average molecular weight: 2,500, polydispersity: 1.30). The glass transition temperature of the resin is measured by DSC and found to be 110° C.

Other resins are synthesized by the same method.

Incidentally, RB-19* is prepared in the same manner as RB-19 except for charging p-acetoxystyrene and (4'-hydroxyphenyl)methacrylate at a ratio of 85/15 (molar ratio) and changing the amount of the polymerization initiator V-65 at the first addition to 3.6 mol %, and found to have a weight average molecular weight of 4,600 and a polydispersity of 1.65.

Also, RB-19** is prepared in the same manner as RB-19 except for charging p-acetoxystyrene and (4'-hydroxyphenyl)methacrylate at a ratio of 45/55 (molar ratio) and changing the amount of the polymerization initiator V-65 at the first addition to 3.6 mol %, and found to have a weight average molecular weight of 4,400 and a polydispersity of 1.65.

Furthermore, RB-19*** is prepared in the same manner as RB-19 except for charging p-acetoxystyrene and (4'-hydroxyphenyl)methacrylate at a ratio of 45/55 (molar ratio) and changing the amount of the polymerization initiator V-65 at the first addition to 8.0 mol %, and found to have a weight average molecular weight of 1,400 and a polydispersity of 2.3.

The structure, molecular weight and polydispersity of the resin (A) used in Examples are shown below.

(RB-1)
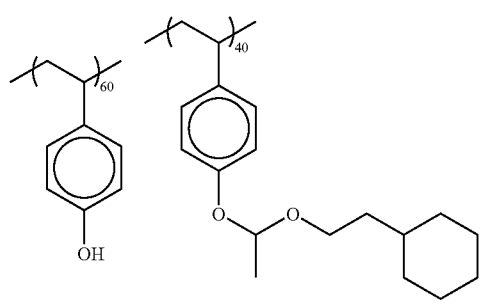
Mw 3500
Mw/Mn 1.4
(RB-2)
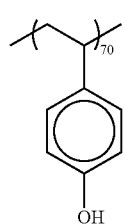
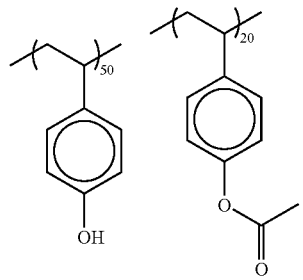
Mw 1500
Mw/Mn 1.4
(RB-3)
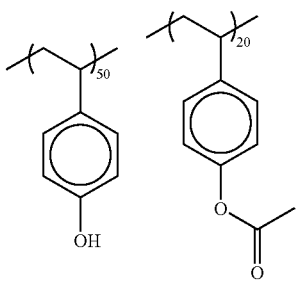
Mw 2000
Mw/Mn 1.4
(RB-4)
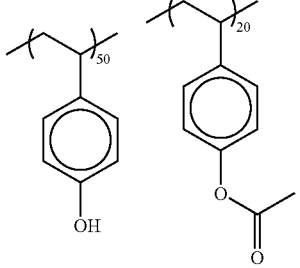
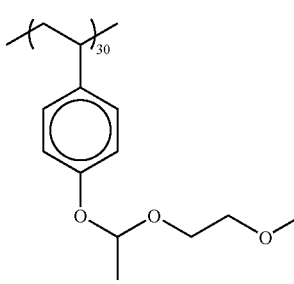
Mw 3000
Mw/Mn 1.4
(RB-5)
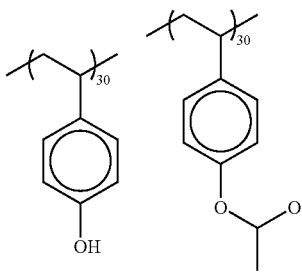
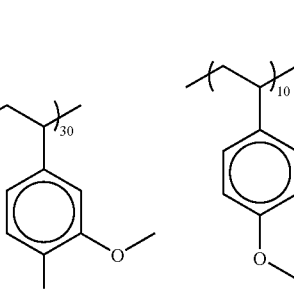
Mw 3000
Mw/Mn 1.4
(RB-6)
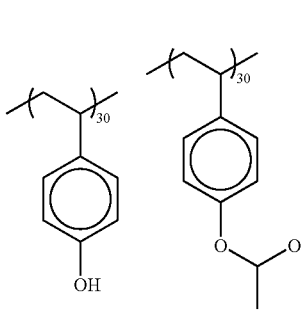

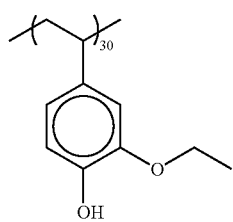

(RB-12)
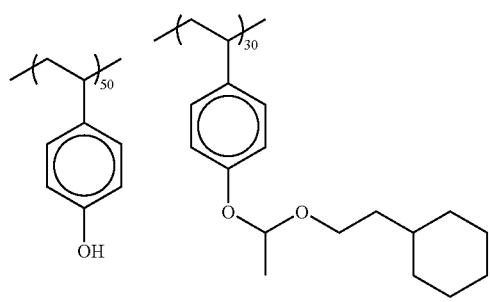
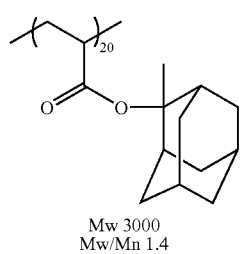
Mw 3000
Mw/Mn 1.4
(RB-13)
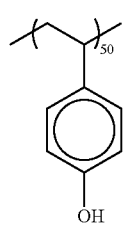
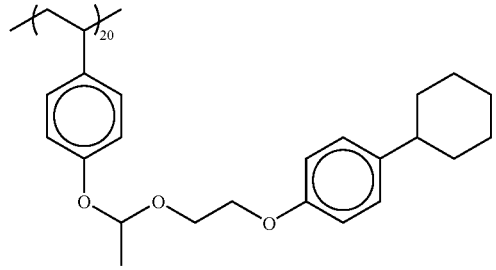
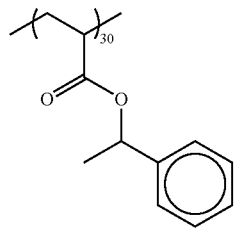
Mw 2500
Mw/Mn 1.4
(RB-14)
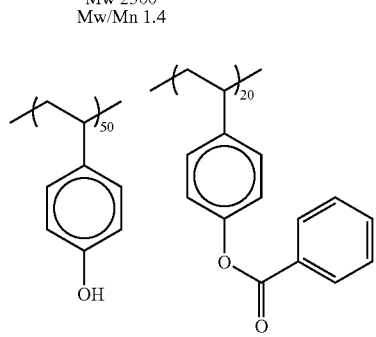
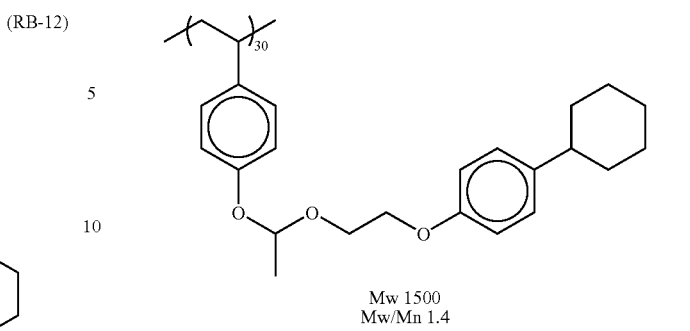
Mw 1500
Mw/Mn 1.4
(RB-15)
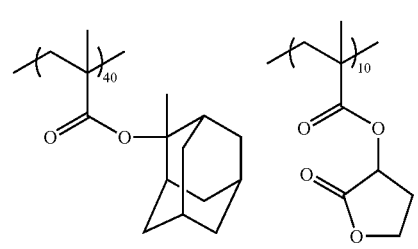
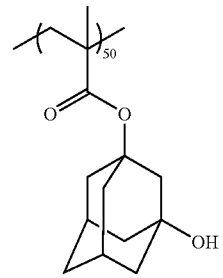
Mw 2500
Mw/Mn 1.4
(RB-16)
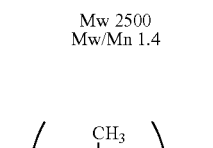
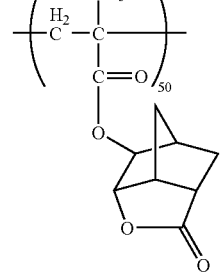
Mw 2500
Mw/Mn 1.4
(RB-17)
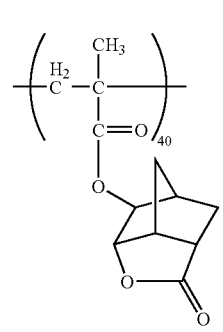

-continued

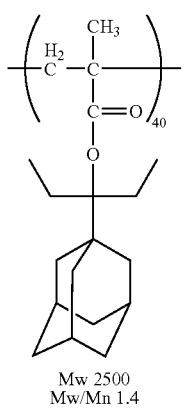

Mw 2500
Mw/Mn 1.4

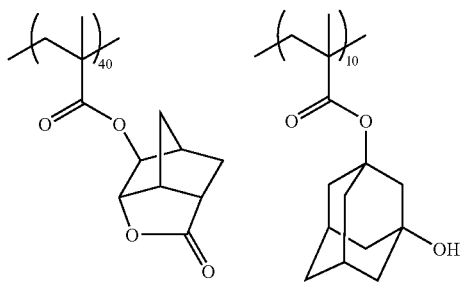

Mw 2500
Mw/Mn 1.4

(RB-18)

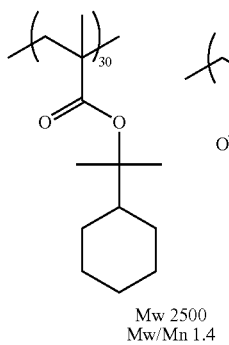

(RB-19)

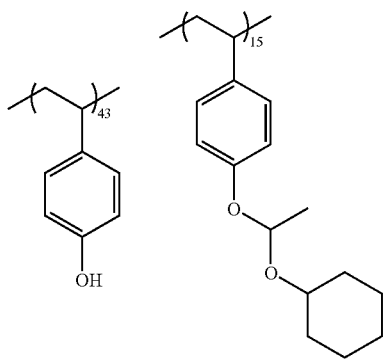

-continued

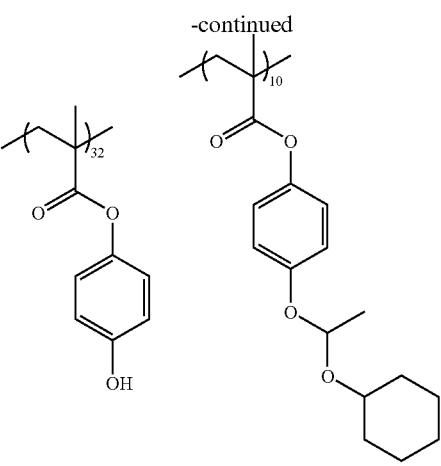

Tg: 110° C.
Mw 2500
Mw/Mn 1.30

EXAMPLES AND COMPARATIVE EXAMPLES

The components shown in Table 1 below are dissolved in a mixed solvent of propylene glycol monomethyl ether acetate and propylene glycol monomethyl ether at a ratio of 80:20 by mass, the obtained solution is filtered through a polytetrafluoroethylene filter having a pore size of 0.1 µm to prepare a positive resist solution having a solid content concentration shown in Table 1, and the evaluation is performed as follows. In the composition shown in the Table, the contents of respective components are 90.5 parts by mass of resin, 8.0 parts by mass of acid generator, and 1.5 parts by mass of basic compound. Separately from the components shown in Table 1, polyoxyethylene lauryl ether is added as a surfactant in an amount of 0.1 mass % based on the entire solid content.

<Evaluation of Resist>

The positive resist solution immediately after the preparation and the positive resist solution stored at 4° C. for 3 months after the preparation each is uniformly coated on a 12-inch hexamethyldisilazane-treated silicon substrate by using a spin coater at a rotation speed of 1,250 rpm and dried under heating on a hot plate at 120° C. for 60 seconds to form a resist film having a thickness of 60 nm.

[Sensitivity]

The obtained resist film is subjected to surface exposure by using EUV (wavelength: 13 nm) while changing the exposure amount in steps of 1 mJ/cm$^2$ in the range of 0 to 35 mJ/cm$^2$ and further baked at 110° C. for 90 seconds. Thereafter, the dissolution rate at each exposure amount is measured by using an aqueous 2.38 mass % tetramethylammonium hydroxide (TMAH) solution to obtain a dissolution rate curve. In the dissolution rate curve, the minimum exposure amount required to allow complete dissolution of the resist film in a development time of 60 seconds is defined as Eth sensitivity.

The same evaluation is performed after storing the resist composition at 4° C. for 3 months.

Dissolution Contrast:

The resist coated film is open-frame exposed in steps of 1 mJ/cm$^2$ to a maximum of 35 mJ/cm$^2$, and the time until the resist film is completely dissolved is measured at each exposure amount. The ratio between the dissolution rate of the unexposed area and the maximum dissolution rate of the exposed area is defined as dissolution contrast.

The evaluation results are shown in Table 1.

TABLE 1

| | Resin | Acid Generator | Basic Compound | Solid Content Concentration (mass %) | Dissolution Contrast | Eth Sensitivity (immediately after preparation) (mJ/cm$^2$) | Eth Sensitivity (after storage at 4° C. for 3 months) (mJ/cm$^2$) |
|---|---|---|---|---|---|---|---|
| Example 1 | RB-19 | z5 | D-1 | 3.0 | 3.5 × 10$^2$ | 16.9 | 17.1 |
| Example 2 | RB-1 | z6 | D-2 | 3.0 | 5.1 × 10$^2$ | 17.1 | 17.4 |
| Example 3 | RB-2 | z19 | D-2 | 2.5 | 4.8 × 10$^2$ | 16.2 | 16.4 |
| Example 4 | RB-4 | z37 | D-1 | 4.0 | 2.9 × 10$^2$ | 16.1 | 16.2 |
| Example 5 | RB-6 | z50 | D-3 | 4.5 | 4.6 × 10$^2$ | 16.6 | 17.0 |
| Example 6 | RB-6 | z66 | D-3 | 3.5 | 4.7 × 10$^2$ | 15.7 | 15.9 |
| Example 7 | RB-9 | z12 | D-2 | 3.5 | 9.6 × 10$^2$ | 18.0 | 18.1 |
| Example 8 | RB-11 | z13 | D-3 | 2.5 | 1.2 × 10$^3$ | 18.1 | 18.2 |
| Example 9 | RB-13 | z5 | D-2 | 3.0 | 6.3 × 10$^2$ | 16.8 | 17.0 |
| Example 10 | RB-1 | z68 | D-2 | 4.0 | 5.3 × 10$^2$ | 17.0 | 17.1 |
| Example 11 | RB-1 | z57 | D-3 | 2.5 | 5.4 × 10$^2$ | 16.6 | 16.6 |
| Example 12 | RB-1 | z40 | D-3 | 3.0 | 5.2 × 10$^2$ | 16.8 | 16.9 |
| Comparative Example 1 | RB-19* | z5 | D-1 | 3.0 | 1.6 × 10$^2$ | 19.1 | 22.4 |
| Comparative Example 2 | RB-19** | z5 | D-1 | 3.0 | 1.2 × 10$^2$ | 20.3 | 25.6 |
| Comparative Example 3 | RB-19 | z5 | D-1 | 5.0 | 3.3 × 10$^2$ | 17.3 | 19.4 |
| Comparative Example 4 | RB-19 | z5 | D-1 | 2.0 | 3.3 × 10$^2$ | 17.1 | 19.3 |
| Comparative Example 5 | RB-19*** | z5 | D-1 | 3.0 | 1.3 × 10$^2$ | 15.0 | 18.1 |
| Comparative Example 6 | RB-18 | z5 | D-1 | 3.0 | 5.5 × 10$^3$ | 14.8 | 17.2 |

D-1: Tri-n-hexylamine
D-2: 2,4,6-Triphenylimidazole
D-3: Tetra-(n-butyl)ammonium hydroxide As seen from the results in Table 1, in the characteristic evaluation by the irradiation with EUV light, the positive resist composition of the present invention is excellent in the aging stability as compared with the composition of Comparative Examples. Furthermore, it is seen from Examples that the same effects are obtained also when irradiated with EB and X-ray.

According to the present invention, as regards the pattern formation by the irradiation for electron beam, X-ray or EUV exposure, a positive resist composition with good aging stability of sensitivity and a pattern forming method using the composition can be provided.

The entire disclosure of each and every foreign patent application from which the benefit of foreign priority has been claimed in the present application is incorporated herein by reference, as if fully set forth.

What is claimed is:

1. A positive resist composition for electron beam, X-ray or EUV exposure, comprising:
   (A) a resin capable of decomposing by the action of an acid to increase the solubility in an alkali developer; and
   (B) a compound capable of generating a sulfonic acid upon irradiation with an actinic ray or radiation,
   wherein
   the resin (A) is a resin having a phenolic hydroxyl group and having a weight average molecular weight of 1,500 to 3,500,
   the positive resist composition has a property of decomposing by the action of an acid and causing the dissolution rate in an aqueous 2.38 wt% tetramethylammonium hydroxide solution at 23° C. under normal pressure to increase in a range of 200 to 5,000 times, and
   the positive resist composition has a solid content concentration of from 2.5 to 4.5 mass%.

2. The positive resist composition for electron beam, X-ray or EUV exposure as claimed in claim 1, wherein
   the resin (A) comprises a structural unit derived from a hydroxystyrene and a structural unit derived from a derivative of a hydroxystyrene.

3. A pattern forming method comprising:
   forming a resist film from the positive resist composition claimed in claim 1; and
   subjecting the resist film to exposure with electron beam, X-ray or EUV and development.

4. The positive resist composition for electron beam, X-ray or EUV exposure as claimed in claim 1, wherein the solid content concentration is from 3.0 to 4.0%.

5. The positive resist composition for electron beam, X-ray or EUV exposure as claimed in claim 1, wherein the amount of the resin (A) is from 40 to 99.9 mass% based on the entire solids content of the composition.

6. The positive resist composition for electron beam, X-ray or EUV exposure as claimed in claim 1, wherein only one kind of the resin (A) is used.

* * * * *